(12) United States Patent
Lee et al.

(10) Patent No.: US 12,147,666 B2
(45) Date of Patent: Nov. 19, 2024

(54) NON-VOLATILE MEMORY DEVICE INCLUDING MULTI-STACK MEMORY BLOCK AND OPERATING METHOD THEREOF

(71) Applicant: Samsung Electronics Co., Ltd., Suwon-si (KR)

(72) Inventors: Yohan Lee, Suwon-si (KR); Jaeduk Yu, Suwon-si (KR); Jiho Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 82 days.

(21) Appl. No.: 18/052,428

(22) Filed: Nov. 3, 2022

(65) Prior Publication Data

US 2023/0146041 A1    May 11, 2023

(30) Foreign Application Priority Data

Nov. 10, 2021  (KR) .................. 10-2021-0154260
Mar. 30, 2022  (KR) .................. 10-2022-0039874

(51) Int. Cl.
*G06F 3/06* (2006.01)

(52) U.S. Cl.
CPC ............ *G06F 3/0607* (2013.01); *G06F 3/064* (2013.01); *G06F 3/0653* (2013.01); *G06F 3/0679* (2013.01)

(58) Field of Classification Search
CPC .......... G06F 3/06; G06F 3/0607; G06F 3/064; G06F 3/0653; G06F 3/0679
See application file for complete search history.

(56) References Cited

U.S. PATENT DOCUMENTS

| 10,283,204 B2 | 5/2019  | Choi et al. |
| 10,614,889 B2 | 4/2020  | Ko et al. |
| 10,691,372 B1 | 6/2020  | Seetharaman et al. |
| 10,699,789 B2 | 6/2020  | Lee et al. |
| 10,879,266 B1 | 12/2020 | Wu et al. |

(Continued)

OTHER PUBLICATIONS

D. Y. Wu, S. F. Chen, C.-J. Lin and Y. -C. King, "Dummy Read Scheme for Lifetime Improvement of MLC NAND Flash Memories," in IEEE Transactions on Device and Materials Reliability, vol. 16, No. 4, pp. 583-587, Dec. 2016.*

(Continued)

*Primary Examiner* — Pierre Michel Bataille
(74) *Attorney, Agent, or Firm* — Harness, Dickey & Pierce, P.L.C.

(57) ABSTRACT

According to an example embodiment of the inventive concepts, an operating method of a memory system including a memory controller and a non-volatile memory device, the non-volatile memory device being operated under control by the memory controller and the non-volatile memory including a first memory block and a second memory block, the method includes determining, by the memory controller, whether the first memory block satisfies a block reset condition, in response to the first memory block satisfying the block reset condition, applying a turn-on voltage to word lines of dummy cells included in the first memory block, transferring data pre-programmed in the first memory block to the second memory block, erasing the first memory block, and re-programming the dummy cells of the first memory block.

20 Claims, 13 Drawing Sheets

(56) References Cited

U.S. PATENT DOCUMENTS

| | | | |
|---|---|---|---|
| 10,892,019 B2 | 1/2021 | Nam et al. | |
| 11,037,631 B2 | 6/2021 | Pachamuthu et al. | |
| 2010/0046289 A1* | 2/2010 | Baek | G11C 16/349 |
| | | | 365/185.2 |
| 2011/0222340 A1* | 9/2011 | Lee | G11C 16/06 |
| | | | 365/185.2 |
| 2012/0257464 A1* | 10/2012 | Moriwaki | G11C 11/419 |
| | | | 365/189.11 |
| 2018/0158505 A1* | 6/2018 | Lee | G11C 7/1006 |
| 2019/0102088 A1* | 4/2019 | Fang | G06F 11/1048 |
| 2020/0043556 A1* | 2/2020 | Moon | G06F 3/0652 |
| 2021/0249087 A1 | 8/2021 | Oh | |

OTHER PUBLICATIONS

X. Zou, L. Jin, D. Jiang, Y. Zhang, G. Chen and Z. Huo, "Investigation of Cycling-Induced Dummy Cell Disturbance in 3D NAND Flash Memory," in IEEE Electron Device Letters, vol. 39, No. 2, pp. 188-191, Feb. 2018.*

* cited by examiner

NON-VOLATILE MEMORY DEVICE INCLUDING MULTI-STACK MEMORY BLOCK AND OPERATING METHOD THEREOF

CROSS-REFERENCE TO RELATED APPLICATIONS

This application is based on and claims priority under 35 U.S.C. § 119 to Korean Patent Application Nos. 10-2021-0154260, filed on Nov. 10, 2021, in the Korean Intellectual Property Office, and 10-2022-0039874, filed on Mar. 30, 2022, in the Korean Intellectual Property Office, the disclosures of each of which are incorporated by reference herein in their entireties.

BACKGROUND

The inventive concepts relate to a non-volatile memory device including a multi-stack memory block, and/or an operating method thereof.

A system using semiconductor chips uses dynamic random access memory (DRAM) as an operating memory or main memory to store data or instructions used by a host or to perform a computational operation, and uses a storage device including a non-volatile memory as a storage medium. As demands for storage devices having a large capacity have increased, the number of memory cells and word lines stacked on a substrate of a non-volatile memory has increased.

SUMMARY

One or more example embodiments relates to a highly-reliable non-volatile memory device in which a threshold voltage of dummy word lines is monitored and a block reset operation is performed based on a result of the monitoring.

According to an example embodiment of the inventive concepts, an operating method of a memory system including a memory controller and a non-volatile memory device, the non-volatile memory device being operated under a control of the memory controller and the non-volatile memory device including a first memory block and a second memory block, the method includes determining, by the memory controller, whether the first memory block satisfies a block reset condition, in response to the first memory block satisfying the block reset condition, applying a turn-on voltage to word lines of dummy cells included in the first memory block, transferring data pre-programmed in the first memory block to the second memory block, erasing the first memory block, and re-programming the dummy cells of the first memory block.

According to an example embodiment of the inventive concepts, an operating method of a non-volatile memory device, the non-volatile memory device including first to third memory blocks, each of the first to third memory blocks including a first sub-block, a second sub-block, and a dummy block, wherein the first sub-block includes a first plurality of memory cells, the second sub-block includes a second plurality of memory cells, and the dummy block includes a plurality of dummy cells, the second sub-block being arranged on the first sub-block, and the dummy block is arranged between the first sub-block and the second sub-block. The method includes receiving a command for the first memory block to perform an operation, in response to the first memory block satisfying the block reset condition, performing a block reset operation by the first memory block, wherein the performing of the block reset operation includes applying a turn-on voltage to dummy word lines included in the dummy block of the first memory block, transferring, to the second memory block, data previously programmed in the first sub-block or the second sub-block of the first memory block, performing an erase operation entirely on the first memory block, and re-programming the dummy cells of the first memory block.

According to an example embodiment of the inventive concepts, a semiconductor apparatus includes a memory controller configured to generate any one of a program command, a read command, or an erase command, and a non-volatile memory device which is operated under a control of the memory controller, the non-volatile memory device includes a first memory block and a second memory block, wherein the memory controller is configured to determine whether the first memory block satisfies a block reset condition, and the non-volatile memory device is configured to, in response to the first memory block satisfying the block reset condition, apply a turn-on voltage to word lines of dummy cells included in the first memory block, transfer data previously programmed in the first memory block to the second memory block, then erase the first memory block, and re-program the dummy cells of the first memory block.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EXAMPLE EMBODIMENTS

Figure 1:
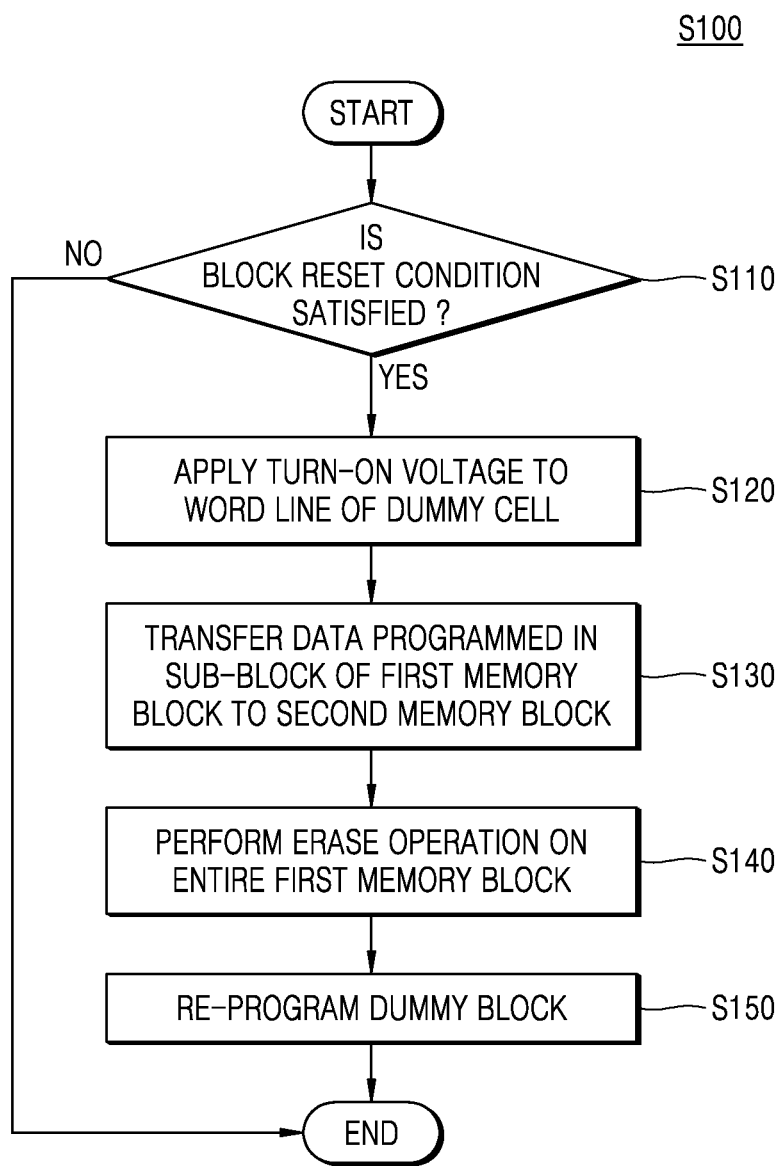
FIG. 1 is a flowchart of a block reset method of a non-volatile memory device, according to some example embodiments of the inventive concepts.

Hereinafter, example embodiments will be described in detail with reference to the accompanying drawings.

When describing with reference to the drawings, the same or corresponding elements are given the same reference characters, and redundant descriptions thereof are omitted.

FIG. 1 is a flowchart of a block reset method S100 of a non-volatile memory device, according to some example embodiments of the inventive concepts.

Referring to FIG. 1, the block reset method S100 of the non-volatile memory device may include a plurality of operations S110 to S150. A plurality of cell strings may be divided into two sub-blocks, as described later with reference to FIG. 5, or may be divided into three or more sub-blocks. The plurality of cell strings may include a dummy block between the sub-blocks, as described later with reference to FIG. 5.

In operation S110, it may be determined whether a first memory block (BLK1 in FIG. 3) satisfies a block reset condition. To determine whether the block reset condition is satisfied, a threshold voltage ($Vth_{DC}$) of dummy cells included in a dummy block (DB in FIGS. 4 and 5) may be monitored. The threshold voltage ($Vth_{DC}$) of the dummy cells may be compared to a first reference voltage V1. When a voltage level of the threshold voltage ($Vth_{DC}$) of the dummy cells is greater than a voltage level of the first reference voltage V1, an error may occur during a read operation. In other words, the voltage level of the first reference voltage V1 may have a threshold value at which the first memory block (BLK1 in FIG. 3) may normally perform a read operation. Normally performing a read operation or other operation means performing a read operation under the designed conditions for the read operation. A read operation performed under conditions other than the designed conditions (for example if the voltage level of the first voltage V1 is below a threshold voltage) may cause the read operation to be unsuccessful. Accordingly, the voltage level of the first reference voltage V1 may have a reference value for determining whether a block reset operation is necessary or desired. The voltage level of the first reference voltage V1 may have a preset value or may have a value input by a user. The voltage level of the first reference voltage V1 is described in greater detail later with reference to FIG. 9.

When the voltage level of the threshold voltage ($Vth_{DC}$) of the dummy cells is greater than 0 V and less than the voltage level of the first reference voltage V1, the first memory block (BLK1 in FIG. 3) may not satisfy the block reset condition. Accordingly, operation S110 may be terminated. In other words, when the voltage level of the threshold voltage ($Vth_{DC}$) of the dummy cells is greater than 0 V and less than the voltage level of the first reference voltage V1, it may be determined that the block reset operation is unnecessary or undesired.

When the voltage level of the threshold voltage ($Vth_{DC}$) of the dummy cells is less than 0 V or greater than the voltage level of the first reference voltage V1, the first memory block (BLK1 in FIG. 3) may satisfy the block reset condition. Accordingly, operation S120 may be performed. In other words, when the voltage level of the threshold voltage ($Vth_{DC}$) of the dummy cells is less than 0 V or greater than the voltage level of the first reference voltage V1, it may be determined that the block reset operation is necessary or desired. Consequently, it may also be determined to perform the block reset operation.

In operation S120, a turn-on voltage may be applied to word lines of the dummy cells. A voltage level of the turn-on voltage may be greater than the voltage level of the threshold voltage ($Vth_{DC}$) of the dummy cells. When the voltage level of the threshold voltage ($Vth_{DC}$) of the dummy cells is greater than 0 V and less than the voltage level of the first reference voltage V1, the voltage level of the turn-on voltage may be greater than a voltage level of a voltage applied to the word lines of the dummy cells to turn on the dummy cells. For example, the voltage level of the turn-on voltage may be greater than a maximum voltage level (e.g., first voltage level) that may be achieved by a read voltage or that the read voltage is configured to obtain. The read voltage may include a voltage applied to word lines of memory cells included in a sub-block during a read operation. For example, the voltage level of the turn-on voltage may be greater than the voltage level of the first reference voltage V1. Accordingly, a channel may be provided in the dummy cell.

Figure 3:
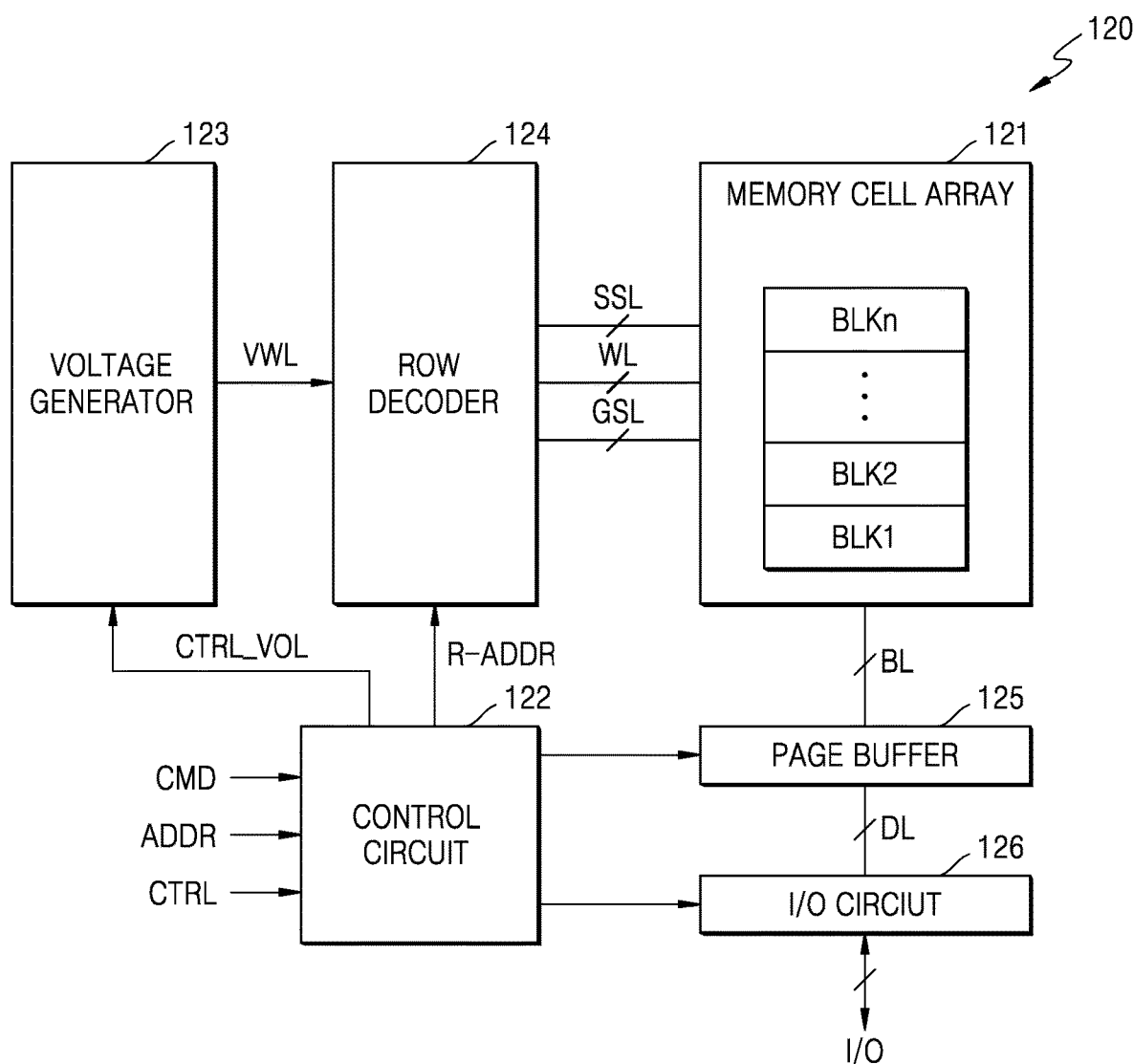
FIG. 3 is a block diagram of a non-volatile memory device according to some example embodiments of the inventive concepts.

In operation S130, data pre-programmed in a sub-block included in the first memory block (BLK1 in FIG. 3) may be transferred to a second memory block (BLK2 in FIG. 3). For example, when a first sub-block (SB1 in FIG. 5) and a second sub-block (SB2 in FIG. 5) arranged at an upper end (e.g., above) of the first sub-block (SB1 in FIG. 5) are included in the first memory block (BLK1 in FIG. 5) and the first sub-block (SB1 in FIG. 5) is pre-programmed, data pre-programmed in the first sub-block (SB1 in FIG. 5) may be transferred to the second memory block (BLK2 in FIG. 3). The second memory block (BLK2 in FIG. 3) may include a normal memory block. The normal memory block may denote a memory block in which a voltage level of a threshold voltage ($Vth_{DC}$) of dummy cells included in the memory block is greater than 0 V and less than a voltage level of the first reference voltage V1.

Figure 4:
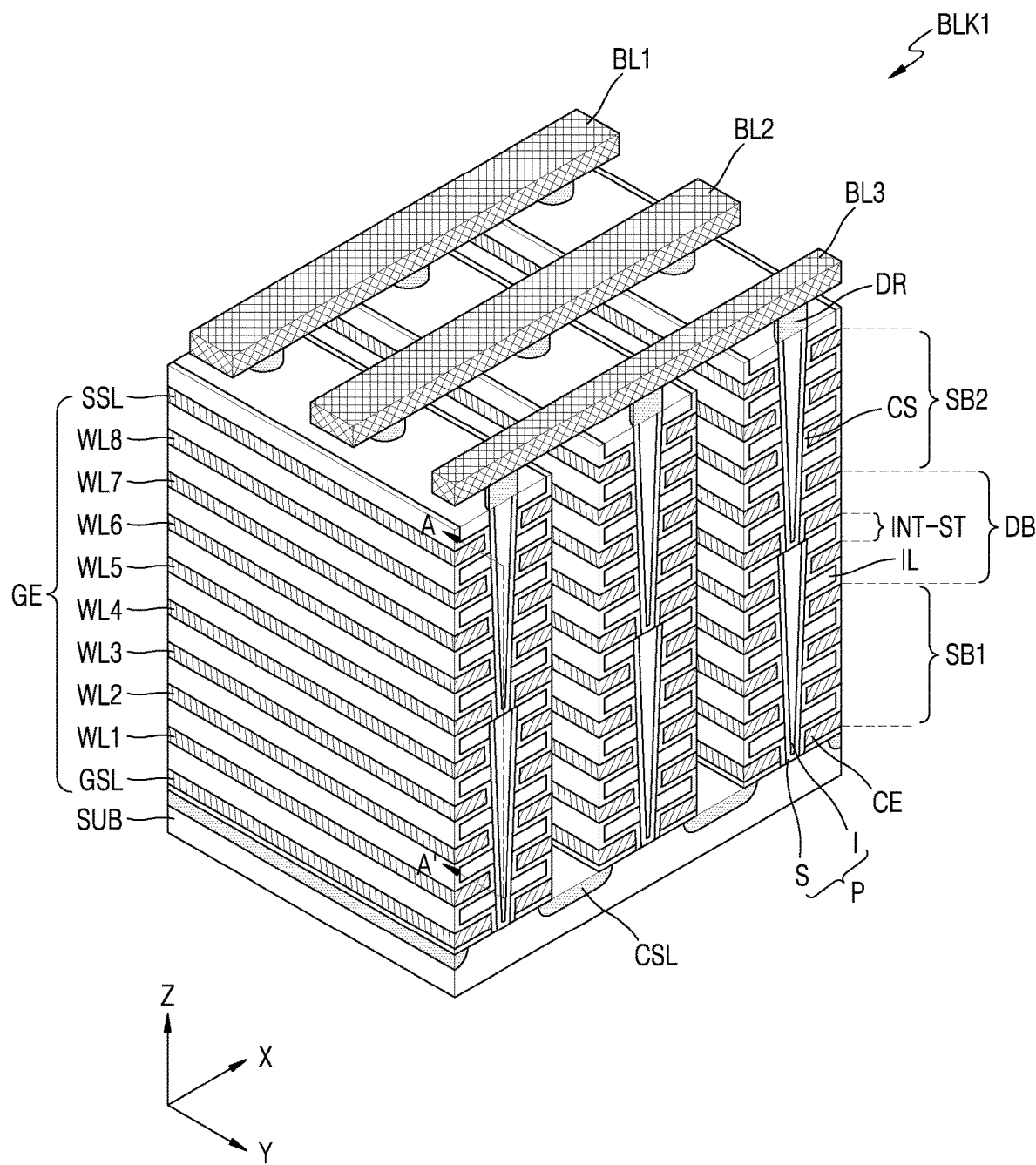
FIG. 4 is a perspective view illustrating a memory block according to some example embodiments of the inventive concepts.
Figure 5:
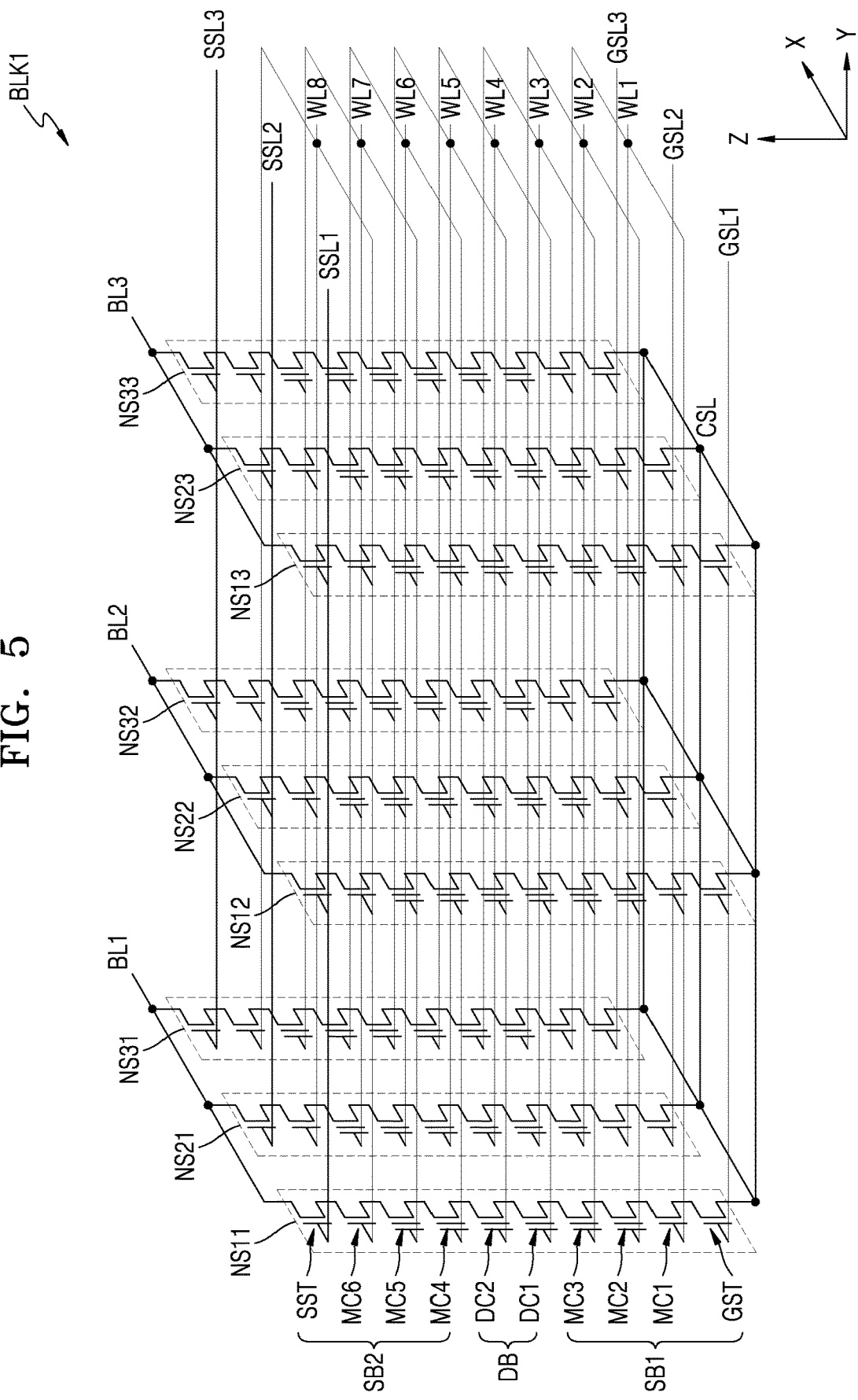
FIG. 5 is an equivalent circuit diagram of a non-volatile memory device according to some example embodiments of the inventive concepts.

In operation S140, an erase operation may be performed on the entire first memory block (BLK1 in FIG. 5). Accordingly, data programmed in the first sub-block (SB1 in FIG. 5), the second sub-block (SB2 in FIG. 5), and the dummy block (DB in FIGS. 4 and 5) included in the first memory block (BLK1 in FIG. 5) may all be erased. In other words, the first memory block may be reset by erasing the data programmed in the first sub-block SB1, the second sub-block SB2, and the dummy block DB.

In operation S150, dummy cells included in the dummy block (DB in FIGS. 4 and 5) may be re-programmed A voltage level of a threshold voltage ($Vth_{DC}$) of the re-programmed dummy cells may be less than the voltage level of the first reference voltage V1. By re-programming the dummy cells, it may be controlled that the voltage level of the threshold voltage (Vth,DC) of the dummy cells is kept in a certain range.

According to the inventive concepts, even when the voltage level of the threshold voltage ($Vth_{DC}$) of the dummy cells is greater than the voltage level of the first reference voltage V1, and thus, the memory block is not capable of performing a normal read operation, the pre-programmed data may be transferred to another memory block via the dummy cells which is turned on in operation S120, so that data loss may be prevented. Furthermore, an erase operation may be performed on an entire memory block not capable of performing a normal read operation, to recover a defective memory block, and thus, the productivity of the non-volatile memory device may be improved. In addition, the voltage level of the threshold voltage ($Vth,_{DC}$) of the dummy cells may be kept in a certain range, and thus, the reliability of operations of the non-volatile memory device may be improved.

The block reset method S100 including the plurality of operations S110 to S150 may be applicable to each of program operation, erase operation, and read operation of the non-volatile memory device. Detailed operations of the non-volatile memory device are described in greater detail later with reference to FIGS. 7 to 10.

Figure 2:
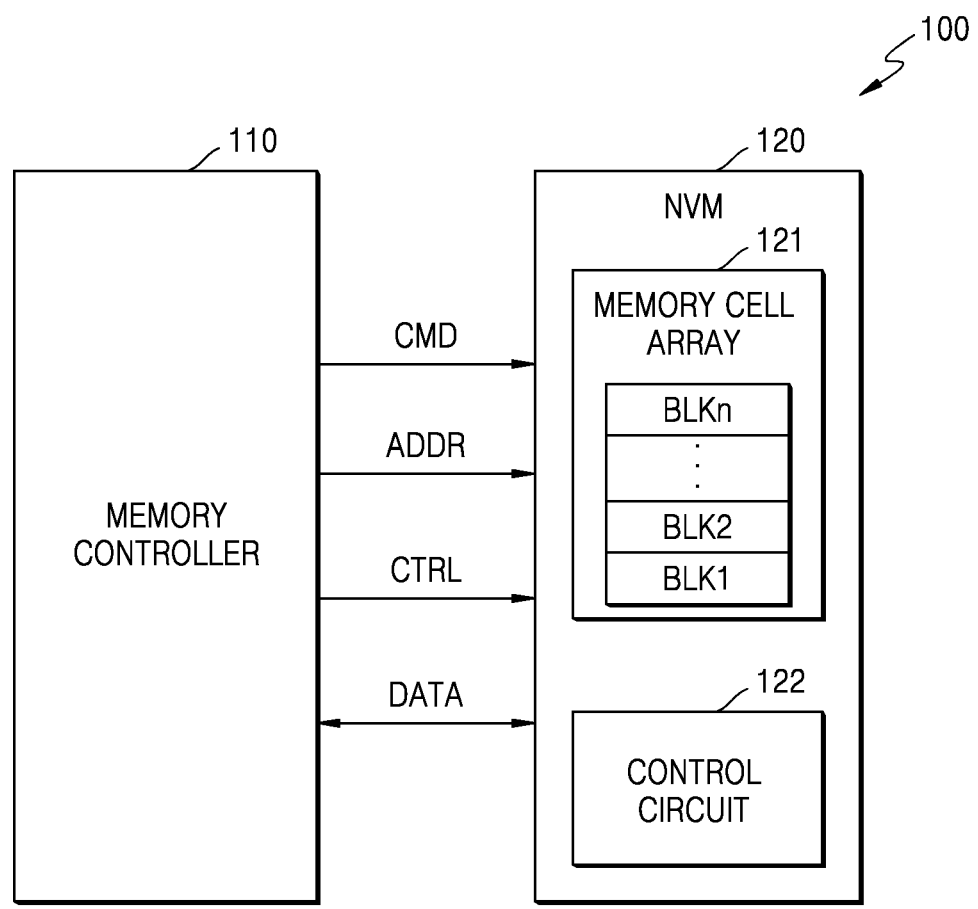
FIG. 2 is a conceptual block diagram of a memory system according to some example embodiments of the inventive concepts.

FIG. 2 is a conceptual block diagram of a memory system 100 according to some example embodiments of the inventive concepts.

Referring to FIG. 2, the memory system 100 may include a memory controller 110 and at least one non-volatile memory device (NVM) 120. In FIG. 2, the memory system 100 includes one non-volatile memory device 120. However, the inventive concepts are not limited thereto, and the memory system 100 may include a plurality of non-volatile memory devices. The non-volatile memory device 120 may include negative-AND (NAND) flash memory.

In some example embodiments, the memory system 100 may include an internal memory embedded in an electronic apparatus. For example, the memory system 100 may include an embedded universal flash storage (UFS) memory device, an embedded multi-media card (eMMC), or a solid-state drive (SSD). In some example embodiments, the memory system 100 may include an external memory that is detachable from the electronic apparatus. For example, the memory system 100 may include at least one of a UFS memory card, a compact flash (CF) card, a secure digital (SD) card, a micro secure digital (Micro-SD) card, a mini secure digital (Mini-SD) card, an extreme digital (xD) card, and a memory stick.

The memory controller 110 may process a request from a host. The memory controller 110 may control operations of the non-volatile memory device 120 according to the request from the host. The memory controller 110 may control the non-volatile memory device 120 such that the non-volatile memory device 120 performs any of a program operation, a read operation, and an erase operation. In addition, the memory controller 110 may also control the non-volatile memory device 120 such that an internal management operation or background operation of the non-volatile memory device 120 is performed, regardless of the request from the host.

The memory controller 110 may execute firmware. For example, when the non-volatile memory device 120 is a NAND flash memory device, the memory controller 110 may execute firmware, such as a flash translation layer, to control communication between the host and the non-volatile memory device 120. The memory controller 110 may be implemented by using a system-on-chip (SoC), an application-specific integrated circuit (ASIC), a field-programmable gate array (FPGA), or the like.

Although not shown, the memory controller 110 may further include an error correction code (ECC) unit. The ECC unit may provide accurate data by detecting and correcting an error in data input from the host or data output from the non-volatile memory device 120.

The non-volatile memory device 120 may perform a program operation, a read operation, and an erase operation, under control by the memory controller 110. The non-volatile memory device 120 may receive, from the memory controller 110, a write command CMD, an address ADDR, a control signal CTRL, and data DATA, and write data to memory cells corresponding to the address ADDR. The non-volatile memory device 120 may receive a read command CMD and an address ADDR from the memory controller 110 and output, to the memory controller 110, data DATA read from the memory cells corresponding to the address ADDR. The non-volatile memory device 120 may receive an erase command CMD and an address ADDR from the memory controller 110 and erase data from memory cells corresponding to the address ADDR.

The non-volatile memory device 120 may include a memory cell array 121 and a control circuit 122. The memory cell array 121 may include a plurality of memory blocks BLK1 to BLKn. Each of the plurality of memory blocks BLK1 to BLKn may be implemented in a memory cell array in which a plurality of memory cells have a two-dimensional array structure or a three-dimensional array structure. The memory cells may include a NAND flash memory cell, but are not limited thereto, and the memory cells may include resistive memory cells, such as resistive random-access memory (RAM; ReRAM) memory cells, phase-change RAM (PRAM) memory cells, and magnetoresistive RAM (MRAM) memory cells. Each of the plurality of memory blocks BLK1 to BLKn may be a unit for an erase operation, and according to some example embodiments, the erase operation may be performed in units of sub-blocks included in each of the plurality of memory blocks.

As described later with reference to FIG. 4, each of the plurality of memory blocks BLK1 to BLKn may include the first sub-block (SB1 in FIG. 4) and the second sub-block (SB2 in FIG. 4), which are stacked in a vertical direction with respect to a substrate. In addition, each of the plurality of memory blocks BLK1 to BLKn may include the dummy block (DB in FIG. 4) between the first sub-block (SB1 in FIG. 4) and the second sub-block (SB2 in FIG. 4). The dummy block (DB in FIG. 4) may include a boundary surface (or a junction portion) of a first stack and a second stack defined in a process, and dummy cells adjacent to the boundary surface. However, the inventive concepts are not limited thereto, and according to some example embodiments, each of the plurality of memory blocks BLK1 to BLKn may include n sub-blocks, where n is a natural number greater than or equal to 3, and (n−1) dummy blocks arranged at a boundary of the sub-blocks.

The control circuit 122 may perform a program operation so that the threshold voltages of the memory cells of the memory cell array 121 have target states, based on a program command received from the memory controller 110. The program operation may be performed by program loops based on a voltage increase of a program voltage, and each of the program loops may include a program period and a verification period. The control circuit 122 may perform a read operation on a memory cell selected from among the memory cells included in the memory cell array 121, based on a read command received from the memory controller 110. The control circuit 122 may perform an erase operation on a memory cell selected from among the memory cells included in the memory cell array 121, based on an erase command received from the memory controller 110.

The control circuit 122 may monitor a threshold voltage of dummy cells at the boundary of the sub-blocks from among the memory cells included in the memory cell array 121. The control circuit 122 may transmit a result of the monitoring of the threshold voltage of the dummy cells to the memory controller 110. The memory controller 110 may determine whether to perform the block reset operation S100 described above with reference to FIG. 1, based on the monitoring result of the threshold voltage of the dummy cells.

For example, when the voltage level of the threshold voltage of the dummy cells is greater than the voltage level of the first reference voltage V1, the memory controller 110 may generate a block reset command CMD and transmit the generated block reset command CMD to the control circuit 122. The control circuit 122 may perform a block reset operation on a memory block selected from among the memory blocks included in the memory cell array 121, based on the received block reset command CMD. A configuration of the non-volatile memory device 120 is described in greater detail below.

FIG. 3 is a block diagram of a non-volatile memory device 120 according to some example embodiments of the inventive concepts. In detail, FIG. 3 is a block diagram for describing the non-volatile memory device 120 in FIG. 2, as an example.

Referring to FIG. 3, the non-volatile memory device 120 may include the memory cell array 121, the control circuit 122, a voltage generator 123, a row decoder 124, a page buffer unit 125, and input/output (I/O) circuit unit 126. Although not shown, the non-volatile memory device 120 may further include an input/output interface.

The memory cell array 121 may be connected to word lines WL, string select lines SSL, ground select lines GSL, and bit lines BL. The memory cell array 121 may be connected to the row decoder 124 via the word lines WL, the string select lines SSL, and the ground select lines GSL, and may be connected to the page buffer unit 125 via the bit lines BL.

The memory cell array 121 may include a three-dimensional (3D) memory cell array. The 3D memory cell array may be monolithically provided at least one physical level of memory cell arrays having an active area and circuitry, wherein the active area is disposed on a silicon substrate, and the circuitry is associated with an operation of the memory cells and is provided on or in the substrate. The term "monolithic" may mean that layers of each level constituting the array are stacked directly above layers of each lower level of the array. The 3D memory cell array may include NAND strings that are vertically arranged such that at least one memory cell is on another memory cell. The at least one memory cell may include a charge trap layer. However, the inventive concepts are not limited thereto, and in another example embodiment, the memory cell array 121 may include a two-dimensional memory cell array.

The memory cell array 121 may include the plurality of memory blocks BLK1 to BLKn. Each of the plurality of memory blocks BLK1 to BLKn may include a plurality of memory cells and a plurality of select transistors. The plurality of memory cells may be connected to the word lines WL, and the plurality of select transistors may be connected to the string select lines SSL or the ground select lines GSL. The plurality of memory cells may include NAND flash memory cells, but are not limited thereto.

Each of the plurality of memory blocks BLK1 to BLKn may have a 3D structure (or a vertical structure). For example, each of the plurality of memory blocks BLK1 to BLKn may include a plurality of NAND strings extending in a direction perpendicular to the substrate. However, the inventive concepts are not limited thereto, and each of the plurality of memory blocks BLK1 to BLKn may have a two-dimensional structure. Each of the plurality of memory blocks BLK1 to BLKn may include a plurality of sub-blocks. For example, each of the plurality of memory blocks BLK1 to BLKn may include two or more sub-blocks.

Each of the memory cells included in the memory cell array 121 may include a multi-level cell (MLC) storing 2 or more bits of data, a triple-level cell (TLC) storing three bits of data, or a quad-level cell (QLC) storing four bits of data. Accordingly, the plurality of memory blocks BLK1 to BLKn may include at least one of a multi-level cell block including MLCs, a triple-level cell block including TLCs, and a quad-level cell block including QLCs.

When a program voltage is applied to the memory cell array 121, the plurality of memory cells may be in a program state, and when an erase voltage is applied to the memory cell array 121, the plurality of memory cells may be in an erase state. Each of the memory cells may have an erase state or at least one program state, which are differentiated according to a threshold voltage $V_{th}$. For example, when a memory cell is an MLC, the memory cell may have an erase state or at least three program states.

The control circuit 122 may output various internal control signals for performing a program operation, read operation, erase operation, and block reset operation on the memory cell array 121, based on the command CMD, the address ADDR, and the control signal CTRL received from the memory controller (110 in FIG. 2). The control circuit 122 may provide a row address R_ADDR to the row decoder 124, provide a column address to the input/output circuit unit 126, and provide a voltage control signal CTRL_VOL to the voltage generator 123. The control circuit 122 may monitor a threshold voltage of dummy cells included in the memory cell array 121 and transmit a result of the monitoring to the memory controller (110 in FIG. 2).

The voltage generator 123 may generate voltages of various types to ensure that the memory cell array 121 performs a program operation, block program operation, read operation, and erase operation, based on the voltage control signal CTRL_VOL received from the control circuit 122. For example, the voltage generator 123 may generate a word line voltage VWL, such as a program voltage, a read voltage, a pass voltage, an erase voltage, an erase verification voltage, or a turn-on voltage.

The row decoder 124 may be connected to the memory cell array 121 via a plurality of string select lines SSL, a plurality of word lines WL, and a plurality of ground select lines GSL. The row decoder 124 may select any of the plurality of memory blocks BLK1 to BLKn of the memory cell array 121 in response to the row address R-ADDR, and may select any of word lines WL of the selected memory block. For example, during a program operation, the row decoder 124 may apply a program voltage and verification voltage to the selected word lines, and may apply a pass voltage to an unselected word line. In addition, the row decoder 124 may select some string select lines from among the string select lines SSL or some ground select lines from among the ground select lines GSL, in response to the row address R_ADDR.

The page buffer unit 125 may be operated as a write driver or a detection amplifier according to an operation mode. During a read operation, the page buffer unit 125 may sense a bit line BL of a selected memory cell under control by the control circuit 122. The sensed data may be stored in a latch provided within the page buffer unit 125. In addition, the page buffer unit 125 may dump the data stored in the latch to the input/output circuit unit 126 via a data line DL under control by the control circuit 122.

The input/output circuit unit 126 may temporarily store a command CMD, an address ADDR, and data DATA received from the outside of the non-volatile memory device 120 via an input/output line I/O. The input/output circuit unit 126 may temporarily store read data of the non-volatile memory device 120 and output the read data to the outside via the input/output circuit unit 126 at a designated time.

FIG. 4 is a perspective view illustrating a first memory block BLK1 according to some example embodiments of the inventive concepts. In detail, FIG. 4 representatively illustrates the first memory block BLK1 from among the plurality of memory blocks BLK1 to BLKn in FIG. 3. The first memory block BLK1 may include NAND strings or cell strings having a 3D structure or vertical structure, and the first memory block BLK1 may include structures extending in a plurality of directions X, Y, and Z. Hereinafter, reference is made to FIGS. 1 and 2.

Referring to FIG. 4, the first memory block BLK1 may be provided in a vertical direction Z with respect to a substrate SUB. The substrate SUB may have a first conductive type (e.g., p-type), and may have a common source line CSL thereon, the common source line CSL being doped with impurities of a second conductive type (e.g., n-type).

A plurality of insulating materials IL extending in a second vertical direction Y may be sequentially provided in the vertical direction Z in an area of the substrate SUB between the common source lines CSL. The plurality of insulating materials IL may be provided apart from each other by a certain distance in a first horizontal direction X. The insulating materials IL may include an insulating material, such as silicon oxide.

A channel structure P may be provided on the substrate SUB between the common source lines CSL, the channel structure P being sequentially arranged in the second horizontal direction Y and passing through the insulating materials IL in the vertical direction Z. The channel structure P may be connected to the substrate SUB via the insulating materials IL. The channel structure P may include a plurality of materials. For example, the channel structure P may include a surface layer S and an inner layer I. The surface layer S may include a silicon material having a first conductive type and may function as a channel area. In some example embodiments, the channel structure P may be referred to as a vertical channel structure or pillar. The inner layer I may include an insulating material, such as silicon oxide, or an air gap.

A charge storage layer CS may be provided along the insulating materials IL, the channel structure P, and an exposed surface of the substrate SUB. The charge storage layer CS may include a gate insulation layer (also referred to as "a tunneling insulation layer"), a charge trap layer, and a blocking insulation layer. For example, the charge storage layer CS may have an oxide-nitride-oxide (ONO) structure. In addition, a gate electrode GE, such as a ground select line GSL, a string select line SSL, and word lines WL1 to WL8, may be provided on an exposed surface of the charge storage layer CS.

A drain contact or drain electrode DR may be provided on the channel structure P. For example, the drain electrode DR may include a silicon material doped with impurities having a second conductive type. Bit lines BL1 to BL3 may be provided on the drain electrode DR, the bit lines BL1 to BL3 extending in the first horizontal direction X and being arranged apart from each other by a certain distance in the second horizontal direction Y.

The first memory block BLK1 may include a first sub-block SB1 and a second sub-block SB2 that are stacked in the vertical direction Z. The first sub-block SB1 may include first to third word lines WL1 to WL3, and the second sub-block SB2 may include fifth to eighth word lines WL5 to WL8. In FIG. 4, each of the sub-blocks includes only three word lines. However, this is for convenience of explanation, and each of the sub-blocks may include more than three word lines.

The first memory block BLK1 may include a dummy block DB between the first sub-block SB1 and the second sub-block SB2. The dummy block DB may include an inter-stack area INT-ST defined in the manufacturing process step of the non-volatile memory device (120 in FIG. 3), and dummy cells (DC1 and DC2 in FIG. 5) adjacent to the inter-stack area INT-ST. The upper surface of the inter-stack area INT-ST may denote a boundary surface (or a junction portion) of the first stack and the second stack of the first memory block BLK1 defined in the manufacturing process step.

The dummy block DB may include fourth and fifth word lines WL4 and WL5, and the fourth and fifth word lines WL4 and WL5 may be referred to as "dummy word lines". The fourth and fifth word lines WL4 and WL5 may include word lines adjacent to the inter-stack area INT-ST. In other words, dummy word lines (e.g., the fourth and fifth word lines WL4 and WL5) may include word lines adjacent to the junction portion of the first stack and the second stack of the first memory block BLK1. In FIG. 4, the dummy block DB includes two dummy word lines. However, this is for convenience of explanation, and the dummy block DB may include more than two dummy word lines.

FIG. 5 is an equivalent circuit diagram of a non-volatile memory device according to some example embodiments of the inventive concepts. In detail, FIG. 5 is an equivalent circuit diagram of the first memory block BLK1 in FIG. 4.

Referring to FIG. 5, the first memory block BLK1 may include NAND strings NS11 to NS33, word lines WL1 to WL8, bit lines BL1 to BL3, ground select lines GSL1 to GSL3, string select lines SSL1 to SSL3, and the common source line CSL. In FIG. 5, each of the cell strings NS11 to NS33 includes six memory cells MC1 to MC6 and two dummy cells DC1 and DC2 that are connected to the eight word lines WL1 to WL8. However, the inventive concepts are not limited thereto.

For example, one or more dummy cells may be provided between the string select transistor SST and the sixth memory cell MC6, in each of the cell strings. According to some example embodiments, one or more dummy cells may be provided between the ground select transistor GST and the first memory cell MC1, in each of the cell strings.

The dummy cells DC1 and DC2 may have the same structure as the memory cells MC1 to MC6, and may be either unprogrammed (e.g., when programming is inhibited), or programmed differently from the way in which the memory cells MC1 to MC6 are programmed For example, when the memory cells MC1 to MC6 are programmed to have two or more threshold voltage distributions, the dummy cells DC1 and DC2 may be programmed to have one threshold voltage distribution range or a smaller number of threshold voltage distributions than the memory cells MC.

Each of the cell strings (e.g., NS11) may include the string select transistor SST, the plurality of memory cells MC1 to MC6, the plurality of dummy cells DC1 and DC2, and the ground select transistor GST, which are connected in series to each other. Each of the plurality of memory cells MC1 to MC6 and the plurality of dummy cells DC1 and DC2 may be connected to a corresponding one of the word lines WL1 to WL8. The ground select transistor GST may be connected to a corresponding ground select line (e.g., GSL1). The string select transistor SST may be connected to a corresponding string select line (e.g., SSL1), and may be connected to a corresponding one of the bit lines BL1 to BL3. The ground select transistor GST may be connected to the common source line CSL.

Figure 6:
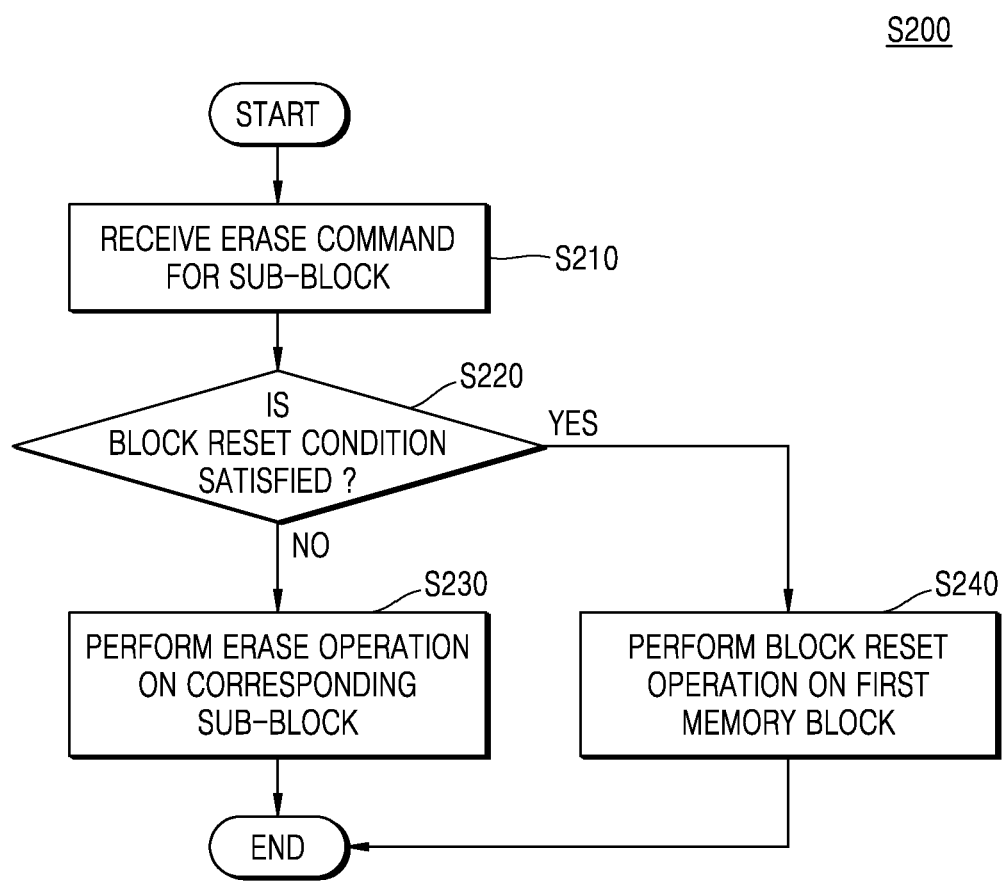
FIG. 6 is a flowchart of an erase method of a non-volatile memory device, according to some example embodiments of the inventive concepts.

FIG. 6 is a flowchart of an erase method of a non-volatile memory device, according to some example embodiments of the inventive concepts. In detail, FIG. 6 is a flowchart of an erase method for a sub-block included in a memory block. Hereinafter, reference is made to FIGS. 1 to 5, and redundant descriptions are omitted.

Referring to FIG. 6, an erase method S200 for a sub-block may include a plurality of operations S210 to S240.

In operation S210, the memory controller (110 in FIG. 2) may receive, from a host thereof, an erase command for the first sub-block (SB1 in FIG. 4) or second sub-block (SB2 in FIG. 4). For example, the first sub-block (SB1 in FIG. 4) and the second sub-block (SB2 in FIG. 4) may be in a programmed state, and the erase command may include a command to perform an erase operation on any one sub-block from among the first sub-block (SB1 in FIG. 4) and the second sub-block (SB2 in FIG. 4). Hereinafter, an erase operation for the second sub-block (SB2 in FIG. 4) is mainly described, for convenience of explanation. However, the inventive concepts are not limited thereto.

In operation S220, the memory controller (110 in FIG. 2) may determine whether the first memory block (BLK1 in FIG. 4) satisfies a block reset condition.

The memory controller (110 in FIG. 2) may receive, from the control circuit (122 in FIG. 3), monitoring information of a threshold voltage of the dummy block (DB of FIG. 4). The memory controller (110 in FIG. 2) may compare a voltage level of a threshold voltage (Vth,$_{DC}$) of the dummy cells included in the dummy block (DB in FIG. 4) with the voltage level of the first reference voltage V1. The voltage level of the first reference voltage V1 may have a threshold value at which the first memory block (BLK1 in FIG. 4) may normally perform a read operation, as described with reference to operation S110 in FIG. 1, and may have a reference value for determining whether a block reset operation is necessary or desired.

When the voltage level of the threshold voltage (Vth,$_{DC}$) of the dummy cells is greater than 0 V and less than the voltage level of the first reference voltage V1, the memory controller (110 in FIG. 2) may determine that the first memory block (BLK1 in FIG. 4) does not satisfy the block reset condition. Accordingly, the non-volatile memory device (120 in FIG. 2) may be controlled to perform operation S230.

When the voltage level of the threshold voltage (Vth,$_{DC}$) of the dummy cells is less than 0 V or greater than the voltage level of the first reference voltage V1, the memory controller (110 in FIG. 2) may determine that the first memory block (BLK1 in FIG. 4) satisfies the block reset operation. Accordingly, the non-volatile memory device (120 in FIG. 2) may be controlled to perform operation S240.

In operation S230, when the voltage level of the threshold voltage (Vth,$_{DC}$) of the dummy cells is greater than 0 V and less than the voltage level of the first reference voltage V1, the non-volatile memory device (120 in FIG. 2) may perform an erase operation on the second sub-block (SB2 in FIG. 4) under control by the memory controller (110 in FIG. 2).

For example, an erase body voltage may be applied to the substrate (SUB in FIG. 4), and an erase voltage may be applied to the sixth to eighth word lines (WL6 to WL8 in FIG. 4) of the second sub-block (SB2 in FIG. 4). The erase body voltage may have a voltage level that is relatively greater than that of the erase voltage, and the erase voltage may include a ground voltage. In this case, a voltage for not injecting a hole into the first sub-block (SB1 in FIG. 4) may be applied to the fourth and fifth word lines WL5 and WL6 of the dummy block (DB in FIG. 4), and a voltage may not be applied to the first to third word lines WL1 to WL3 of the first sub-block (SB1 in FIG. 4).

In operation S240, when the voltage level of the threshold voltage (Vth,$_{DC}$) of the dummy cells is less than 0 V or greater than the voltage level of the first reference voltage V1, the non-volatile memory device (120 in FIG. 2) may perform a block reset operation under control by the memory controller (110 in FIG. 2). The block reset operation may denote operations S120 to S150 described with reference to FIG. 1.

Accordingly, the non-volatile memory device (120 in FIG. 2) may turn on the dummy cells included in the dummy block (DB in FIG. 4) by applying a turn-on voltage to word lines included in the dummy cells (S120 in FIG. 1), and then transfer data programmed in the first sub-block (SB1 in FIG. 4) to the second memory block (BLK2 in FIG. 2) (S130 in FIG. 1). In this case, the second memory block may include a normal memory block including dummy cells in which the voltage level of the threshold voltage (Vth,$_{DC}$) is greater than 0 V and less than the voltage level of the first reference voltage V1. Subsequently, an erase operation may be performed on the entire first memory block (BLK1 in FIG. 4) (S140 in FIG. 1), and dummy cells included in the first memory block (BLK1 in FIG. 4) may be re-programmed (S150 in FIG. 1).

In other words, even in a case in which the first memory block BLK1 receives an erase command with respect to the second sub-block (SB2 in FIG. 4), when the first memory block BLK1 satisfies the block reset operation, an erase operation may be performed on the entire first memory block BLK1 including the first sub-block (SB1 in FIG. 4). In this case, data pre-programmed in the first sub-block (SB1 in FIG. 4) may be transferred to the second memory block (BLK2 in FIG. 2), and thus, the data may be recovered. Accordingly, the reliability of the non-volatile memory device (120 in FIG. 2) may be improved.

Figure 7:
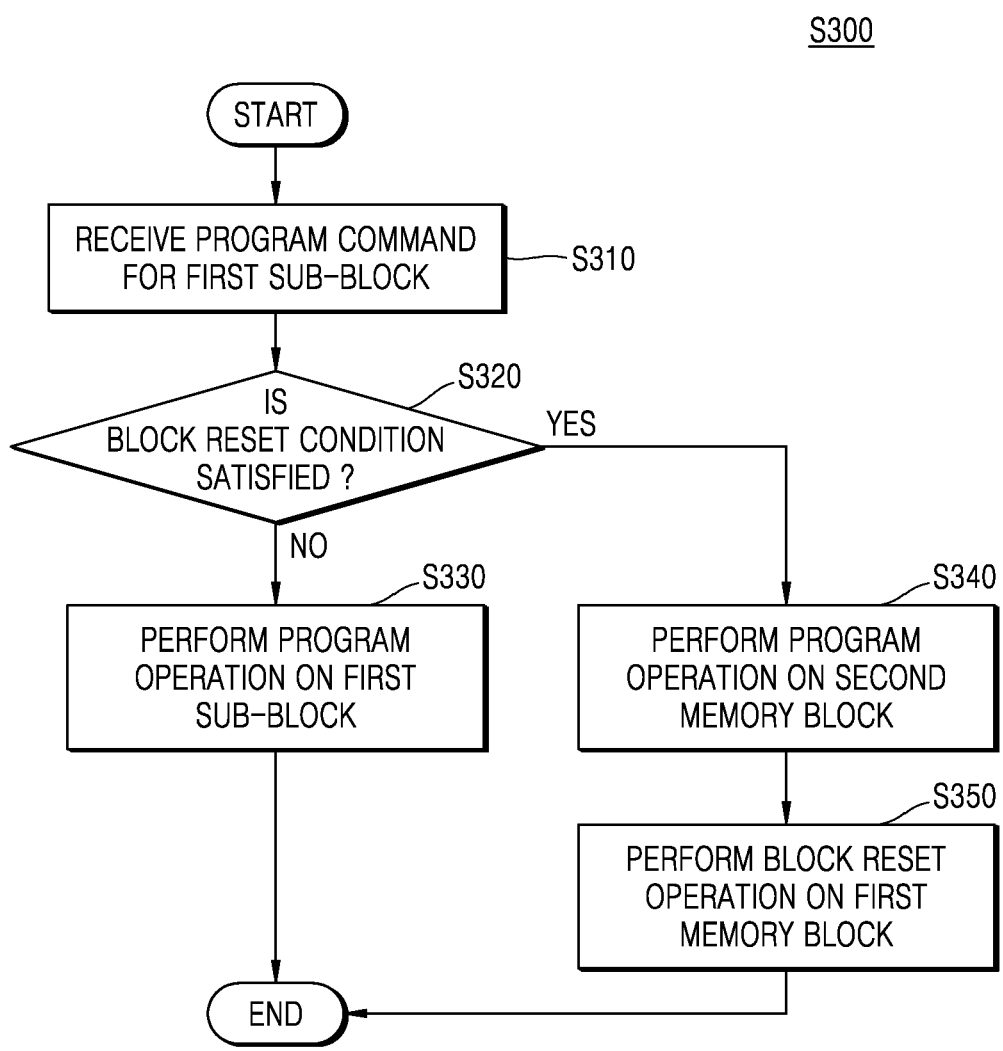
FIG. 7 is a flowchart of a program method of a non-volatile memory device, according to some example embodiments of the inventive concepts.

FIG. 7 is a flowchart of a program method of a non-volatile memory device, according to some example embodiments of the inventive concepts. In detail, FIG. 7 is a flowchart of a method of programming memory cells included in the first sub-block SB1, in a case in which the second sub-block SB2 in FIG. 4 is programmed Hereinafter, reference is made to FIGS. 3 to 6, and redundant descriptions are omitted.

Referring to FIG. 7, a program method S300 for the first sub-block S300 may include a plurality of operations S310 to S350.

In operation S310, the memory controller (110 in FIG. 2) may receive, from a host thereof, a program command for memory cells included in the first sub-block (SB1 in FIG. 4).

In operation S320, the memory controller (110 in FIG. 2) may determine whether the first memory block (BLK1 in FIG. 4) satisfies a block reset condition.

The memory controller (110 in FIG. 2) may receive, from the control circuit (122 in FIG. 3), monitoring information of the threshold voltage (Vth,$_{DC}$) of the dummy cells included in the dummy block (DB in FIG. 4). The memory controller (110 in FIG. 2) may compare the voltage level of the threshold voltage (Vth,$_{DC}$) of the dummy cells with the voltage level of the first reference voltage V1. The voltage level of the first reference voltage V1 may have a threshold value in which the first memory block (BLK1 in FIG. 4) may normally perform a read operation, as described above with reference to the operation S110 in FIG. 1, and may have a reference value for determining whether a block reset operation is necessary or desired.

When the voltage level of the threshold voltage (Vth,$_{DC}$) of the dummy cells is greater than 0 V and less than the voltage level of the first reference voltage V1, the memory controller (110 in FIG. 2) may determine that the first memory block (BLK1 in FIG. 4) does not satisfy the block reset condition. Accordingly, the non-volatile memory device (120 in FIG. 2) may be controlled to perform operation S330. When the voltage level of the threshold voltage (Vth,$_{DC}$) of the dummy cells is less than 0 V or greater than the voltage level of the first reference voltage V1, the memory controller (110 in FIG. 2) may determine that the first memory block (BLK1 in FIG. 4) satisfies the block reset operation. Accordingly, the non-volatile memory device (120 in FIG. 2) may be controlled to perform operation S340.

In operation S330, when the voltage level of the threshold voltage (Vth,$_{DC}$) of the dummy cells is greater than 0 V and less than the voltage level of the first reference voltage V1, the non-volatile memory device (120 in FIG. 2) may perform a program operation on the first sub-block (SB1 in FIG. 4) under control by the memory controller (110 in FIG. 2).

For example, a block pass voltage may be applied to the sixth to eighth word lines WL6 to WL8 in FIG. 4 of the second sub-block (SB2 in FIG. 4) and the fourth and fifth word lines WL5 and WL6 of the dummy block (DB in FIG. 4). A voltage level of the block pass voltage may be greater than a maximum voltage level from among voltage levels that a threshold voltage of a programmed memory cell may have. Thus, the voltage level of the block pass voltage may be higher than the threshold voltage. Accordingly, a channel may be provided in the second sub-block (SB2 in FIG. 4) and the dummy block (DB in FIG. 4), regardless of whether the memory cells of the second sub-block (SB2 in FIG. 4) and the dummy cells of the dummy block (DB in FIG. 4) are programmed The voltage level of the block pass voltage may be equal to or similar to a voltage level of the turn-on voltage.

A program voltage may be applied to a select word line of the first sub-block (SB1 in FIG. 4), and a pass voltage may be applied to non-select word lines. Program loops may be performed by incremental step pulse programming (ISPP), and a voltage level of the program voltage applied to the select word line of the first sub-block (SB1 in FIG. 4) may gradually increase. The pass voltage applied to the non-select word lines of the first sub-block (SB1 in FIG. 4) may be equal to or different from the voltage level of the block pass voltage.

In operation S340, when the voltage level of the threshold voltage (Vth,$_{DC}$) of the dummy cells is less than 0 V or greater than the voltage level of the first reference voltage V1, the non-volatile memory device (120 in FIG. 2) may program the second memory block (BLK2 in FIG. 2) under control by the memory controller (110 in FIG. 2). The second memory block (BLK2 in FIG. 2) may include a normal memory block including dummy cells in which the voltage level of the threshold voltage is greater than 0 V and less than the voltage level of the first reference voltage V1.

In operation S350, the non-volatile memory device (120 in FIG. 2) may perform a block reset operation on the first memory block (BLK1 in FIG. 4) under control by the memory controller (110 in FIG. 2). The block reset operation may denote operations S120 to S150 described with reference to FIG. 1.

Accordingly, the non-volatile memory device (120 in FIG. 2) may apply a turn-on voltage to word lines of the dummy cells included in the dummy block (DB in FIG. 4) (S120 in FIG. 1), and then transfer data pre-programmed in the second sub-block (SB2 in FIG. 4) to a sub-block of the second memory block (BLK2 in FIG. 2) that is unprogrammed, or an $n^{th}$ memory block (BLKn in FIG. 2). Subsequently, the non-volatile memory device (120 in FIG. 2) may perform an erase operation on the entire first memory block (BLK1 in FIG. 4) (S140 in FIG. 1) and re-program the dummy cells included in the dummy block (DB in FIG. 4) (S150 in FIG. 1).

Figure 8:
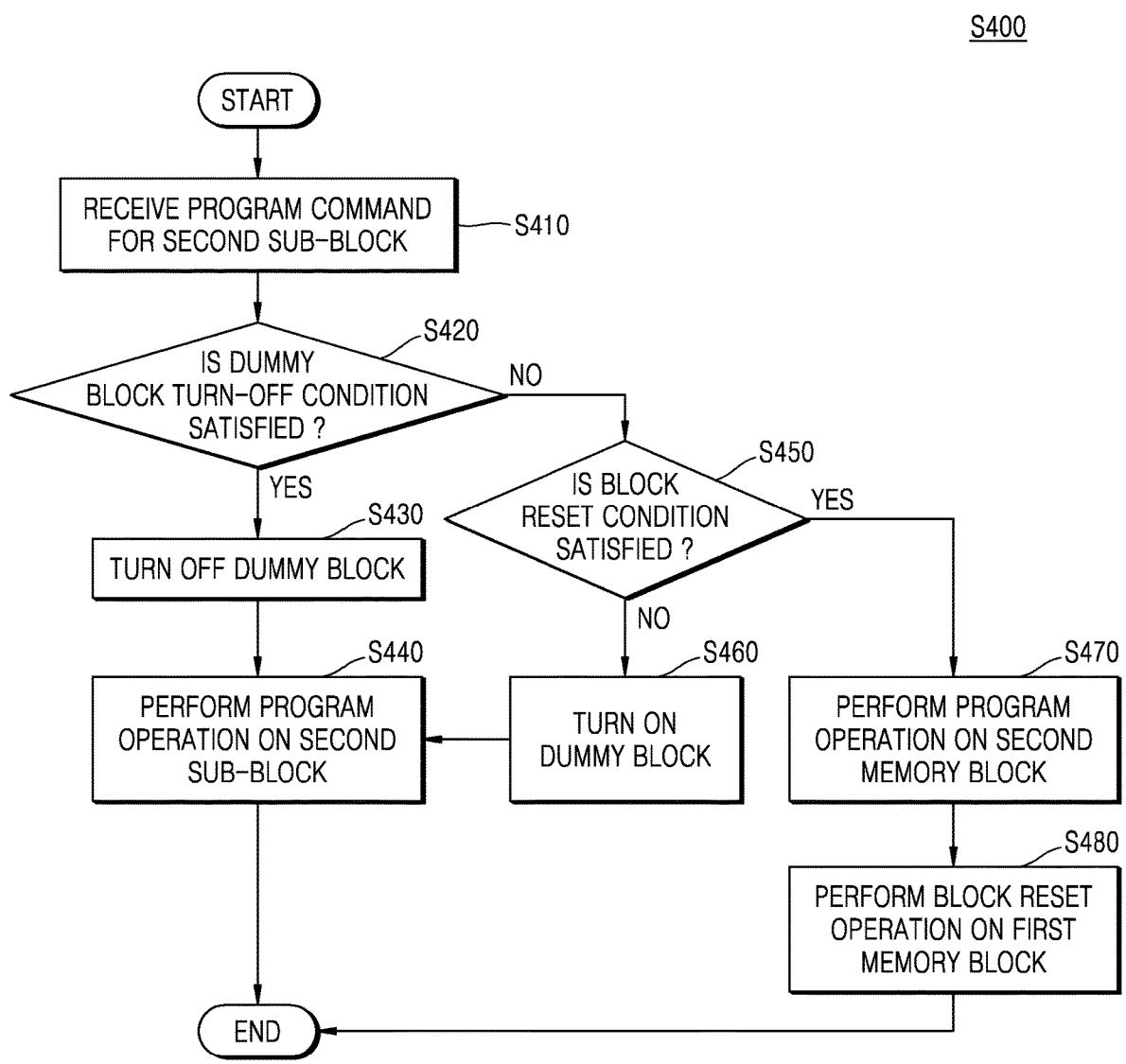
FIG. 8 is a flowchart of a program method of a non-volatile memory device, according to some example embodiments of the inventive concepts.

FIG. 8 is a flowchart of a program method of a non-volatile memory device, according to some example embodiments of the inventive concepts. In detail, FIG. 8 is a flowchart of a method of programming memory cells of the second sub-block SB2, in a state in which the first sub-block SB1 in FIG. 4 is programmed Hereinafter, reference is made to FIGS. 3 to 6, and redundant descriptions are omitted.

Referring to FIG. 8, a program method S400 for the second sub-block may include a plurality of operations S410 to S480.

In operation S410, the memory controller (110 in FIG. 2) may receive, from a host thereof, a program command for memory cells included in the second sub-block (SB2 in FIG. 4).

In operation S420, the memory controller (110 in FIG. 2) may determine whether the first memory block (BLK1 in FIG. 4) satisfies a dummy block turn-off condition. The memory controller (110 in FIG. 2) may receive, from the control circuit (122 in FIG. 3), monitoring information of a threshold voltage of the dummy block (DB of FIG. 4). The memory controller (110 in FIG. 2) may compare a voltage level of a threshold voltage (Vth,$_{DC}$) of the dummy cells included in the dummy block (DB in FIG. 4) with a voltage level of the second reference voltage V2.

When the voltage level of the threshold voltage (Vth,$_{DC}$) of the dummy cells is greater than the voltage level of the second reference voltage V2, the dummy cells may not be normally turned off. In other words, the voltage level of the second reference voltage V2 may have a threshold value in which the dummy cells may electrically block the first sub-block (SB1 in FIG. 4) and the second sub-block (SB2 in FIG. 4). Accordingly, the voltage level of the second reference voltage V2 may have a reference value for determining whether an operation may be performed in units of sub-blocks. The voltage level of the second reference voltage V2 may be a preset value, or may be a value input by a user. The voltage level of the second reference voltage V2 is described in greater detail later with reference to FIG. 9.

When the voltage level of the threshold voltage (Vth,$_{DC}$) of the dummy cells is greater than 0 V and less than the voltage level of the second reference voltage V2, the memory controller (110 in FIG. 2) may determine that the first memory block (BLK1 in FIG. 4) satisfies the dummy block turn-off condition. Accordingly, the non-volatile memory device (120 in FIG. 2) may be controlled to perform operation S430. When the voltage level of the threshold voltage (Vth,$_{DC}$) of the dummy cells is less than 0 V or greater than the voltage level of the second reference voltage V2, the memory controller (110 in FIG. 2) may determine that the first memory block (BLK1 in FIG. 4) does not satisfy the dummy block turn-off condition. Accordingly, the non-volatile memory device (120 in FIG. 2) may be controlled to perform operation S450.

In operation S430, when the voltage level of the threshold voltage (Vth,$_{DC}$) of the dummy cells is greater than 0 V and less than the voltage level of the second reference voltage V2, the non-volatile memory device (120 in FIG. 2) may turn off the dummy cells of the dummy block (DB in FIG. 4) under control by the memory controller (110 in FIG. 2). A turn-off voltage may be applied to the dummy word lines (WL4 and WL5 in FIG. 4). For example, the turn-off voltage may include a ground voltage. Accordingly, the first sub-block (SB1 in FIG. 4) and the second sub-block (SB2 in FIG. 4) may be electrically separated from each other.

In operation S440, the non-volatile memory device (120 in FIG. 2) may perform a program operation on the second sub-block (SB2 in FIG. 4). A program voltage may be applied to a select word line of the second sub-block (SB2 in FIG. 4), and a pass voltage may be applied to a non-select word line. In this case, when the dummy cells of the dummy block (DB in FIG. 4) are turned off in operation S430, the first sub-block (SB1 in FIG. 4) and the second sub-block (SB2 in FIG. 4) may be electrically separated from each other. Accordingly, a ground voltage may be applied to the word lines (WL1 to WL3 in FIG. 4) of the first sub-block, or a voltage may not be applied thereto.

In operation S450, the memory controller (110 in FIG. 2) may determine whether the first memory block (BLK1 in FIG. 4) satisfies a block reset condition. When the voltage level of the threshold voltage (Vth,$_{DC}$) of the dummy cells is less than 0 V or greater than the voltage level of the second reference voltage V2, the memory controller (110 in FIG. 2) may determine whether the first memory block (BLK1 in FIG. 4) satisfies the block reset condition. The memory controller (110 in FIG. 2) may compare the voltage level of the threshold voltage (Vth,$_{DC}$) of the dummy cells with the voltage level of the first reference voltage V1. The voltage level of the first reference voltage V1 may include a threshold value at which the first memory block (BLK1 in FIG. 4) may normally perform a read operation, as described above with reference to operation S110 in FIG. 1.

When the voltage level of the threshold voltage (Vth,$_{DC}$) of the dummy cells is greater than 0 V and less than the voltage level of the first reference voltage V1, the memory controller (110 in FIG. 2) may determine that the first memory block (BLK1 in FIG. 4) does not satisfy the block reset condition. Accordingly, the non-volatile memory device (120 in FIG. 2) may be controlled to perform operation S460. When the voltage level of the threshold voltage (Vth,$_{DC}$) of the dummy cells is less than 0 V and greater than the voltage level of the first reference voltage V1, it may be determined that the first memory block (BLK1 in FIG. 3) satisfies the block reset condition. Accordingly, the non-volatile memory device (120 in FIG. 2) may be controlled to perform operation S470.

In operation S460, when the voltage level of the threshold voltage (Vth,$_{DC}$) of the dummy cells is greater than 0 V and less than the voltage level of the first reference voltage V1, the non-volatile memory device (120 in FIG. 2) may turn on the dummy block (DB in FIG. 4) under control by the memory controller (110 in FIG. 2). To turn on the dummy block (DB in FIG. 4), a turn-on voltage may be applied to the dummy word lines (WL4 and WL5 in FIG. 4).

A voltage level of the turn-on voltage may be greater than the voltage level of the threshold voltage (Vth,$_{DC}$) of the dummy cells. When the voltage level of the threshold voltage (Vth,$_{DC}$) of the dummy cells is greater than 0 V and less than the voltage level of the first reference voltage V1, the voltage level of the turn-on voltage may be greater than a voltage level of a voltage applied to the word line of the dummy cells so as to turn on the dummy cells. For example, the voltage level of the turn-on voltage may be greater than a maximum voltage level that is achievable by a read voltage. The read voltage may include a voltage applied to word lines of memory cells included in a sub-block during a read operation. For example, the voltage level of the turn-on voltage may be greater than the voltage level of the first reference voltage V1. Accordingly, a channel may be provided in the dummy cell. The first sub-block (SB1 in FIG. 4) and the second sub-block (SB2 in FIG. 4) may be electrically connected to each other.

In operation S440, the non-volatile memory device (120 in FIG. 2) may perform a program operation on the second sub-block (SB2 in FIG. 4). A program voltage may be applied to a select word line of the second sub-block (SB2 in FIG. 4), and a pass voltage may be applied to a non-select word line. In this case, when the dummy block (DB in FIG. 4) is turned on in operation S450, the first sub-block (SB1 in FIG. 4) and the second sub-block (SB2 in FIG. 4) are electrically connected to each other, and thus, a pass voltage may be applied to the word lines of the first sub-block (SB1 in FIG. 4). The pass voltage applied to the word lines of the first sub-block (SB1 in FIG. 4) may be equal to the turn-on voltage applied to a dummy cell, or may have a different voltage level.

In operation S470, when the voltage level of the threshold voltage (Vth,$_{DC}$) of the dummy cells is less than 0 V or greater than the voltage level of the first reference voltage V1, the memory controller (110 in FIG. 2) may program data for programming, in the second memory block (BLK2 in FIG. 2). The second memory block (BLK2 in FIG. 2) may include a normal memory block including dummy cells in which the voltage level of the threshold voltage (Vth,$_{DC}$) is greater than 0 V and less than the voltage level of the first reference voltage V1.

In operation S480, the non-volatile memory device (120 in FIG. 2) may perform a block reset operation on the first memory block (BLK1 in FIG. 4) under control by the memory controller (110 in FIG. 2). The block reset operation may denote operations S120 to S150 described with reference to FIG. 1.

Accordingly, a turn-on voltage may be applied to the dummy word lines (WL4 and WL5 in FIG. 5) included in the dummy block (DB in FIG. 4) (S120 in FIG. 1). Subsequently, data programmed in the first sub-block (SB1 in FIG. 4) may be transferred to a sub-block of the second memory block (BLK2 in FIG. 2) that is unprogrammed, or an n$^{th}$ memory block (BLKn in FIG. 2) (S130 in FIG. 1). Thereafter, an erase operation may be performed on the entire first memory block (BLK1 in FIG. 4) (S140 in FIG. 1), and the dummy cells included in the dummy block (DB in FIG. 4) may be re-programmed (S150 in FIG. 1).

Figure 9:
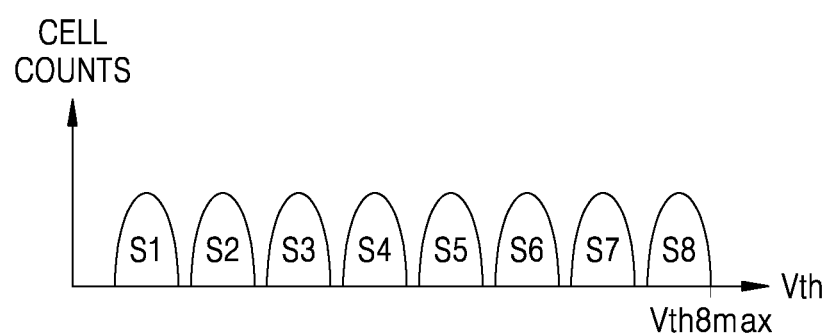
FIG. 9 is a diagram illustrating a distribution of threshold voltages of memory cells that are programmed, according to some example embodiments of the inventive concepts.

FIG. 9 is a diagram illustrating a distribution of threshold voltages of memory cells that are programmed, according to some example embodiments of the inventive concepts. In detail, FIG. 9 is a diagram illustrating a first reference voltage (V1 in FIG. 1) and a second reference voltage (V2 in FIG. 8), and is described with reference to FIGS. 1 to 8.

Referring to FIG. 9, the horizontal axis may indicate threshold voltages of memory cells, and the vertical axis may indicate cell counts, i.e., the number of memory cells. Memory cells (MC1 to MC6 in FIG. 5) may be classified as SLC, MLC, TLC, or QLC, according to the number of bits stored in the memory cells (MC1 to MC6 in FIG. 5). In FIG.

10, the memory cells (MC1 to MC6 in FIG. 5) are TLCs, for convenience of explanation. However, the inventive concepts are not limited thereto.

The memory cells (MC1 to MC6 in FIG. 5) may be in an erase state or a state in which one or more bits are programmed The memory cells (MC1 to MC6 in FIG. 5) may be programmed as any of first to eighth states S1 to S8, and the first to eighth states S1 to S8 may be defined as a range of a threshold voltage $V_{th}$ of the memory cells (MC1 to MC6 in FIG. 5). The first state S1 may denote an erase state, and the eight state S8 may denote a state in which a largest amount (e.g., first amount) of data is programmed.

The voltage level of the first reference voltage V1 may be equal to a maximum value Vth8max of a voltage level that the threshold voltage of the memory cell (MC1 to MC6 in FIG. 5) may have, when the memory cells (MC1 to MC6 in FIG. 5) are programmed to the eighth state S8.

The voltage level of the second reference voltage V2 may be equal to a value obtained by subtracting a maximum value Vth8max of a voltage level that the threshold voltage of the memory cell (MC1 to MC6 in FIG. 5) may have when the memory cell (MC1 to MC6 in FIG. 5) is programmed to the eighth state S 8, by a voltage level of a channel after a read operation is performed. The second reference voltage V2 may include a voltage in which negative boosting occurs when a ground voltage is applied to a word line, or may denote a voltage for maintaining a channel potential. The voltage level of the second reference voltage V2 may be less than the voltage level of the first reference voltage V1.

Figure 10:
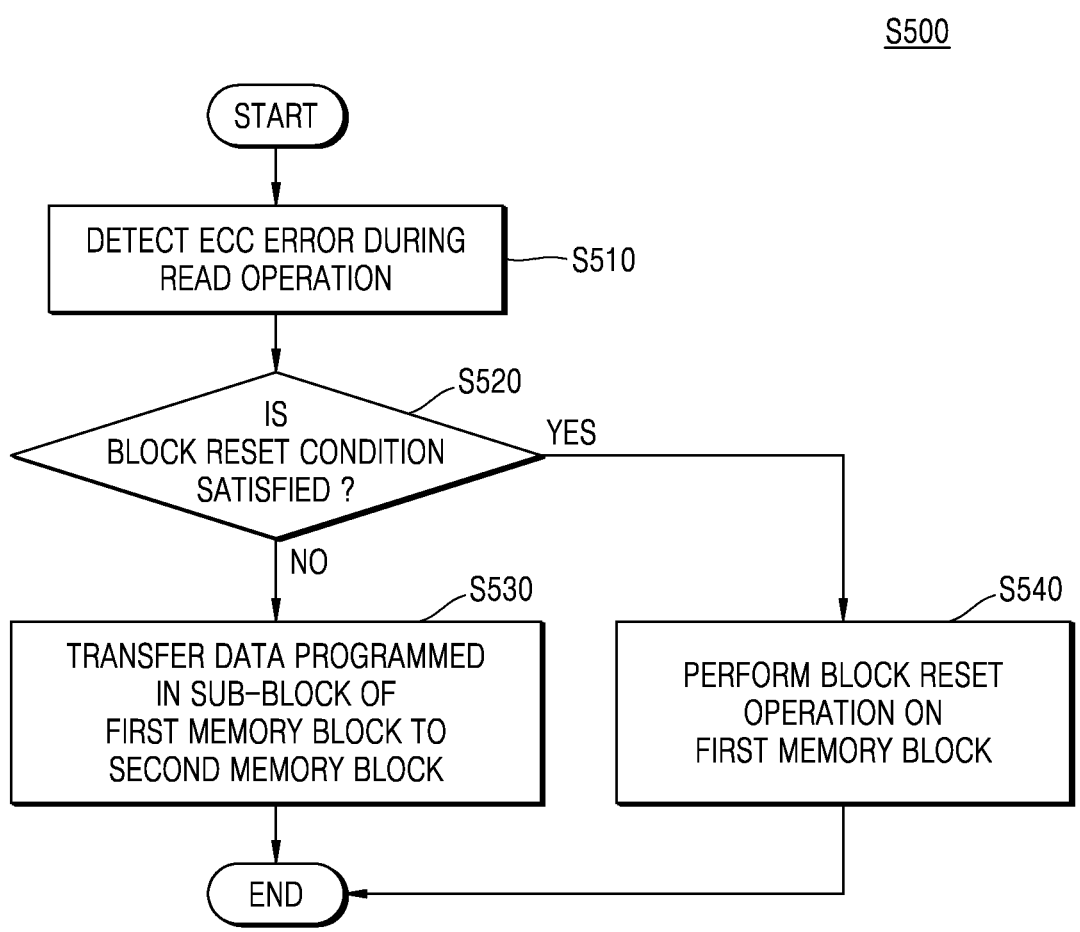
FIG. 10 is a flowchart of a data recovery method of a non-volatile memory device when a read error occurs, according to some example embodiments of the inventive concepts.

FIG. 10 is a flowchart of a data recovery method of a non-volatile memory device when a read error occurs, according to some example embodiments of the inventive concepts. Hereinafter, reference is made to FIGS. 3 to 6, and redundant descriptions are omitted.

Referring to FIG. 10, a data recovery method S500 of a non-volatile memory device may include a plurality of operations S510 to S540.

In operation S510, when the non-volatile memory device (120 in FIG. 2) performs a read operation based on a read command, an ECC error may occur. The non-volatile memory device (120 in FIG. 2) may detect the ECC error. The ECC error may include a case in which data programmed in a memory cell is erroneously read, or a case in which data including an error is not accurately detected or corrected. The ECC error may occur when a read cycle increases.

In operation S520, the memory controller (110 in FIG. 2) may determine whether the first memory block (BLK1 in FIG. 4) satisfies a block reset condition. The memory controller (110 in FIG. 2) may receive, from the control circuit (122 in FIG. 3), monitoring information of the threshold voltage (Vth,$_{DC}$) of the dummy cells included in the dummy block (DB in FIG. 4). The memory controller (110 in FIG. 2) may compare the voltage level of the threshold voltage (Vth,$_{DC}$) of the dummy cells with the voltage level of the first reference voltage V1. As described above with reference to the operation S110 in FIG. 1, the voltage level of the first reference voltage V1 may have a threshold value in which the first memory block (BLK1 in FIG. 4) may normally perform a read operation, and may have a reference value for determining whether a block reset operation is necessary or desired.

When the voltage level of the threshold voltage (Vth,$_{DC}$) of the dummy cells is greater than 0 V and less than the voltage level of the first reference voltage V1, the memory controller (110 in FIG. 2) may determine that the first memory block (BLK1 in FIG. 4) does not satisfy the block reset condition. Thus, the memory controller 110 may determine whether to reset the first memory block BLK1 based on the first reference voltage V1. Accordingly, the non-volatile memory device (120 in FIG. 2) may be controlled to perform operation S530. When the voltage level of the threshold voltage (Vth,$_{DC}$) of the dummy cells is less than 0 V or greater than the voltage level of the first reference voltage V1, it may be determined by the memory controller 110 that the first memory block (BLK1 in FIG. 3) satisfies the block reset condition. Accordingly, the non-volatile memory device (120 in FIG. 2) may be controlled to perform operation S540.

In operation S530, when the voltage level of the threshold voltage (Vth,$_{DC}$) of the dummy cells is greater than 0 V and less than the voltage level of the first reference voltage V1, the non-volatile memory device (120 in FIG. 2) may transfer data stored in the first memory block (BLK1 in FIG. 2) to the second memory block (BLK2 in FIG. 2) under control by the memory controller (110 in FIG. 2). The second memory block (BLK2 in FIG. 2) may include a memory block in which a read cycle is less than a reference value. Accordingly, a read operation may be re-performed on the data transferred to the second memory block (BLK2 in FIG. 2).

In operation S540, when the voltage level of the threshold voltage (Vth,$_{DC}$) of the dummy cells is less than 0 V or greater than the voltage level of the first reference voltage V1, the non-volatile memory device (120 in FIG. 2) may perform a block reset operation under control by the memory controller (110 in FIG. 2). The block reset operation may denote operations S120 to S150 described with reference to FIG. 1.

Accordingly, the non-volatile memory device (120 in FIG. 2) may turn on the dummy cells included in the dummy block (DB in FIG. 4) by applying a turn-on voltage to word lines included in the dummy cells (S120 in FIG. 1), and then transfer data programmed in the first memory block (BLK1 in FIG. 2) to the second memory block (BLK2 in FIG. 2) (S130 in FIG. 1). In this case, the second memory block may include a normal memory block including dummy cells in which the voltage level of the threshold voltage (Vth,$_{DC}$) is greater than 0 V and less than the voltage level of the first reference voltage V1. In addition, the second memory block (BLK2 in FIG. 2) may include a memory block in which a read cycle is less than a reference value. Subsequently, an erase operation may be performed on the entire first memory block (BLK1 in FIG. 4) (S140 in FIG. 1), and dummy cells included in the first memory block (BLK1 in FIG. 4) may be re-programmed (S150 in FIG. 1).

Figure 11:
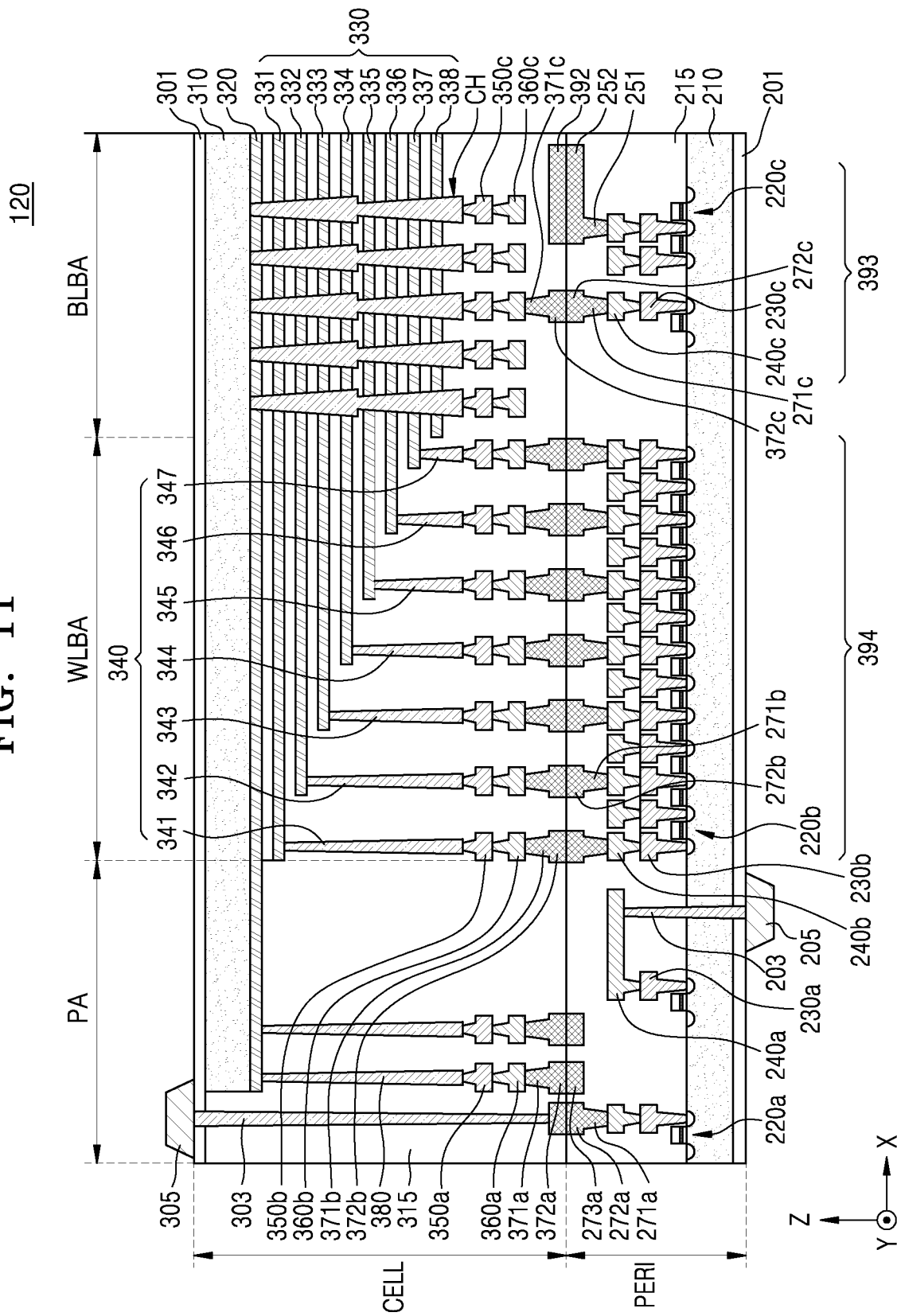
FIG. 11 is a cross-sectional view illustrating a structure of a non-volatile memory device according to some example embodiments of the inventive concepts.

FIG. 11 is a cross-sectional view illustrating a structure of a non-volatile memory device according to some example embodiments of the inventive concepts. In detail, FIG. 11 is a diagram illustrating a structure of the non-volatile memory device 120 in FIGS. 2 and 3. Hereinafter, reference is made to FIGS. 1 and 2.

Referring to FIG. 11, the non-volatile memory device 120 may include a peripheral circuit area PERI and a cell area CELL. Each of the peripheral circuit area PERI and the cell area CELL may include an external pad bonding area PA, a word line bonding area WLBA, and a bit line bonding area BLBA.

The non-volatile memory device 120 may have a chip-to-chip (C2C) structure. The C2C structure may be provided by manufacturing an upper chip including the cell area CELL, on a first wafer, manufacturing a lower chip including the peripheral circuit area PERI, on a second wafer that is different from the first wafer, and then connecting the upper chip and the lower chip to each other by a bonding method. For example, the bonding method may denote a method of electrically connecting a bonding metal provided on an uppermost metal layer of the upper chip and a bonding metal provided on an uppermost metal of the lower chip to each other. For example, when the bonding metal includes copper (Cu), the bonding method may include a Cu—Cu bonding method. In another example embodiment, the bonding metal may include not only Cu, but also aluminum (Al) or tungsten (W).

The peripheral circuit area PERI may include a first substrate 210, an interlayer insulation layer 215, a plurality of circuit elements 220a, 220b, and 220c, first metal layers 230a, 230b, and 230c, and second metal layers 240a, 240b, and 240c, wherein the plurality of circuit elements 220a, 220b, and 220c are provided on the first substrate 210, the first metal layers 230a, 230b, and 230c are respectively connected to the plurality of circuit elements 220a, 220b, and 220c, and the second metal layers 240a, 240b, and 240c are provided on the first metal layers 230a, 230b, and 230c. In some example embodiments, the first metal layers 230a, 230b, and 230c may include W having a relatively high electrical non-resistivity, and the second metal layers 240a, 240b, and 240c may include Cu having a relatively low electrical non-resistivity.

In FIG. 11, only the first metal layers 230a, 230b, and 230c and the second metal layers 240a, 240b, and 240c are shown. However, the inventive concepts are not limited thereto, and at least one metal layer may be further provided on the second metal layers 240a, 240b, and 240c. At least a portion of the at least one metal layer provided on the second metal layers 240a, 240b, and 240c may include Al or the like having a lower electrical non-resistivity than Cu included in the second metal layers 240a, 240b, and 240c.

The interlayer insulation layer 215 may be arranged on the first substrate 210 to cover the plurality of circuit elements 220a, 220b, and 220c, the first metal layers 230a, 230b, and 230c, and the second metal layers 240a, 240b, and 240c, and may include an insulating material, such as silicon oxide and silicon nitride.

Lower bonding metals 271b and 272b may be provided on the second metal layer 240b of the word line bonding area WLBA. In the word line bonding area WLBA, the lower bonding metals 271b and 272b in the peripheral circuit region PERI may be electrically connected to upper bonding metals 371i b and 372b in the cell region CELL in a bonding manner, and the lower bonding metals 271b and 272b and the upper bonding metals 371b and 372b may be formed of aluminum (Al), copper (Cu), tungsten (W), or the like.

The cell area CELL may provide at least one memory block. The cell area CELL may include a second substrate 310 and a common source line 320. Word lines 330 may be stacked on the second substrate 310 in a direction (a Z-axis direction) perpendicular to the upper surface of the second substrate 310. String select lines and a ground select line may be respectively arranged on and below the word lines 330, and the plurality of word lines 330 may be arranged between the string select lines and the ground select line.

In the bit line bonding area BLBA, a channel structure CH may extend in the direction (the Z-axis direction) perpendicular to the upper surface of the second substrate 310 and pass through the word lines 330, the string select lines, and the ground select line. The channel structure CH may include a data storage layer, a channel layer, and a buried insulation layer. The channel layer may be electrically connected to a first metal layer 350c and a second metal layer 360c. For example, the first metal layer 350c may include a bit line contact, and the second metal layer 360c may include a bit line. The bit line 360c may extend in a direction (a Y-axis direction) parallel to the upper surface of the second substrate 310.

An area in which the channel structure CH and the bit line 360c are arranged may be defined as the bit line bonding area BLBA. The bit line 360c may be electrically connected to the circuit elements 220c included in a page buffer 393. For example, the bit line 360c may be connected to the upper bonding metals 371c and 372c of the peripheral circuit area PERI, and the upper bonding metals 371c and 372c may be connected to the lower bonding metals 271c and 272c connected to the circuit elements 220c of the page buffer 393. The page buffer 393 may correspond to the page buffer 393 described with reference to FIG. 3.

In the word line bonding area WLBA, the word lines 330 may each extend in a second direction (an X-axis direction) that is perpendicular to the first direction (the Y-axis direction) and parallel to the upper surface of the second substrate 310, and may be connected to a plurality of cell contact plugs 340. The word lines 330 and the cell contact plugs 340 may be connected to each other through pads provided by at least some of the word lines 330 that extend to have different lengths in the second direction. A first metal layer 350b and a second metal layer 360b may be sequentially connected on the cell contact plugs 340 connected to the word lines 330. The cell contact plugs 340 may be connected to the peripheral circuit area PERI in the word line bonding area WLBA through the upper bonding metals 371i b and 372b of the cell area CELL and the lower bonding metals 271b and 272b of the peripheral circuit area PERI.

The cell contact plugs 340 may be electrically connected to the circuit elements 220b included in the row decoder 124. An operating voltage of the circuit elements 220b may be different from an operating voltage of the circuit elements 220c included in the page buffer 393. For example, the operating voltage of the circuit elements 220b may be less than the operating voltage of the circuit elements 220c. The row decoder 124 may correspond to the row decoder 124 in FIG. 2.

A common source line contact plug 380 may be arranged in the external pad bonding area PA. The common source line contact plug 380 may include a conductive material (e.g., a metal, a metal compound, polysilicon, etc.) and may be electrically connected to the common source line 320. A first metal layer 350a and a second metal layer 360a may be sequentially stacked on the common source line contact plug 380. An area in which the common source line contact plug 380, the first metal layer 350a, and the second metal layer 360a are arranged may be defined as the external pad bonding area PA.

The external pad bonding area PA may include input/output pads 205 and 305. A lower insulation layer 201 covering the lower surface of the first substrate 210 may be provided under the first substrate 210, and a first input/output pad 205 may be provided on the lower insulation layer 201. The first input/output pad 205 may be connected to at least one of the plurality of circuit elements 220a, 220b, and 220c through a first input/output contact plug 203, and may be separated from the first substrate 210 by the lower insulation layer 201. A side insulation layer may be arranged between the first input/output contact plug 203 and the first substrate 210 and electrically separate the first input/output contact plug 203 and the first substrate 210 from each other.

An upper insulation layer 301 covering the upper surface of the second substrate 310 may be provided on the second substrate 310, and a second input/output pad 305 may be arranged on the upper insulation layer 301. The second input/output pad 305 may be connected to at least one of the plurality of circuit elements 220a, 220b, and 220c through a second input/output contact plug 303. In some example embodiments, the second input/output pad 305 may be electrically connected to the circuit element 220a.

The second substrate 310, the common source line 320, and the like may not be arranged in an area in which the second input/output contact plug 303 is arranged. In addition, the second input/output pad 305 may not overlap the word lines 330 in the third direction (the Z-axis direction). The second input/output contact plug 303 may be separated from the second substrate 310 in a direction parallel to the upper surface of the second substrate 310, and may be connected to the second input/output pad 305 via an interlayer insulation layer 315.

According to some example embodiments, the first input/output pad 205 and the second input/output pad 305 may be selectively provided. For example, the non-volatile memory device 120 may include only the first input/output pad 205 arranged on the first substrate 210, or may include only the second input/output pad 305 arranged on the second substrate 310. In some example embodiments, the non-volatile memory device 120 may include both the first input/output pad 205 and the second input/output pad 305.

In each of the external pad bonding area PA and the bit line bonding area BLBA each included in the cell area CELL and the peripheral circuit area PERI, a metal pattern of the uppermost metal layer may be present as a dummy pattern, or the uppermost metal layer may be empty.

In the external pad bonding area PA, the non-volatile memory device 120 may have a lower metal pattern 273a having the same shape as an upper metal pattern 372a of the cell area CELL, in the uppermost metal layer of the peripheral circuit area PERI to correspond to the upper metal pattern 372a provided in the uppermost metal layer of the cell area CELL. The lower metal pattern 273a provided in the uppermost metal layer of the peripheral circuit area PERI may not be connected to an additional contact in the peripheral circuit area PERI. Similarly, in the external pad bonding area PA, the upper metal pattern 372a having the same shape as the lower metal pattern 273a of the peripheral circuit area PERI may be provided in the upper metal layer of the cell area CELL to correspond to the lower metal pattern 273a provided in the uppermost metal layer of the peripheral circuit area PERI.

The lower bonding metals 271b and 272b may be provided on the second metal layer 240b of the word line bonding area WLBA. In the word line bonding area WLBA, the lower bonding metals 271b and 272b of the peripheral circuit area PERI may be electrically connected to the upper bonding metals 371b and 372b of the cell area CELL by a bonding method.

In addition, in the bit line bonding area BLBA, an upper metal pattern 392 having the same shape as a lower metal pattern 252 of the peripheral circuit area PERI may be provided in the uppermost metal layer of the cell area CELL to correspond to the lower metal pattern 252 provided in the uppermost metal layer of the peripheral circuit area PERI. A contact may not be provided on the upper metal pattern 392 provided in the uppermost metal layer of the cell area CELL.

Figure 12:
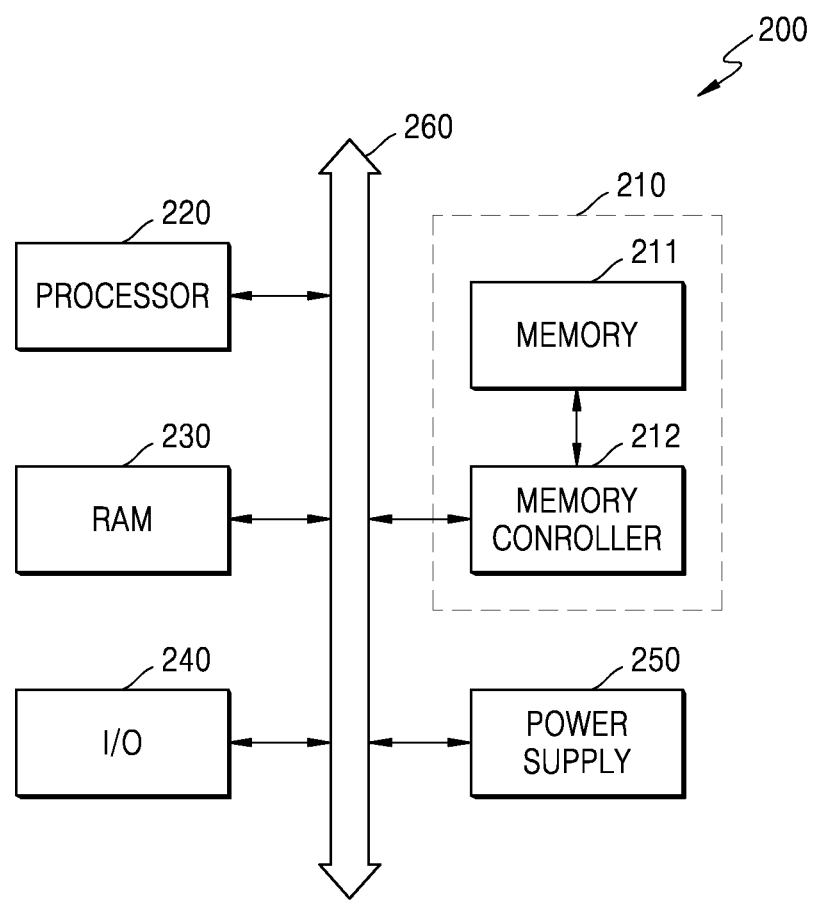
FIG. 12 is a block diagram of a computing system according to some example embodiments of the inventive concepts.

FIG. 12 is a block diagram of a computing system 200 according to some example embodiments of the inventive concepts.

Referring to FIG. 12, a computing system 200 may include a memory system 210, a processor 220, a RAM 230, an input/output device 240, and a power device 250. Although not shown in FIG. 12, the computing system 200 may further include ports capable of communicating with a video card, a sound card, a memory card, a universal serial bus (USB) device, or other electronic devices. The computing system 200 may be implemented as a personal computer, or may be implemented as a portable electronic apparatus, such as a laptop computer, a mobile phone, a personal digital assistant (PDA), and a camera.

The processor 220 may perform specific operations or tasks. According to some example embodiments, the processor 220 may include a micro-processor and a central processing unit (CPU). The processor 220 may perform communication with the RAM 230, the input/output device 240, and the memory system 210 via a bus 260, such as an address bus, a control bus, and a data bus. According to some example embodiments, the processor 220 may be connected to an expansion bus, such as a peripheral component interconnect (PCI) bus.

The memory system 210 may communicate with the processor 220, the RAM 230, and the input/output device 240 via the bus 260. According to a request from the processor 220, the memory system 210 may store data that is received or provide stored data to the processor 220, the RAM 230, or the input/output device 240.

Meanwhile, the memory system 210 may include the memory system 100 described with reference to FIG. 2. The memory system 210 may include a memory 211 and a memory controller 212. The memory 211 may correspond to the non-volatile memory device 120 described with reference to FIGS. 1 to 10. In other words, the memory system 210 may include the non-volatile memory device 120 described with reference to FIGS. 2 to 10.

The memory 211 may be operated under control by the memory controller 212, according to the operating method according to some example embodiments described with reference to FIGS. 1 and 6 to 10. For example, the memory 211 may perform a block reset operation based on a threshold voltage level of dummy cells. The memory controller 212 may determine whether the threshold voltage level of the dummy cells satisfies a condition for performing a block reset operation, and a block reset operation of the memory 211 may be controlled based on the determination.

The RAM 230 may store data necessary or desired for operations of the computing system 200. For example, the RAM 230 may be implemented as DRAM, mobile DRAM, static RAM (SRAM), PRAM, ferroelectric RAM (FRAM), ReRAM (RRAM), and/or magnetic RAM (MRAM).

The input/output device 240 may include an input means, such as a keyboard, a keypad, and a mouse, and an output means, such as a printer and a display. The power device 250 may apply an operating voltage necessary or desired for operations of the computing system 200.

Figure 13:
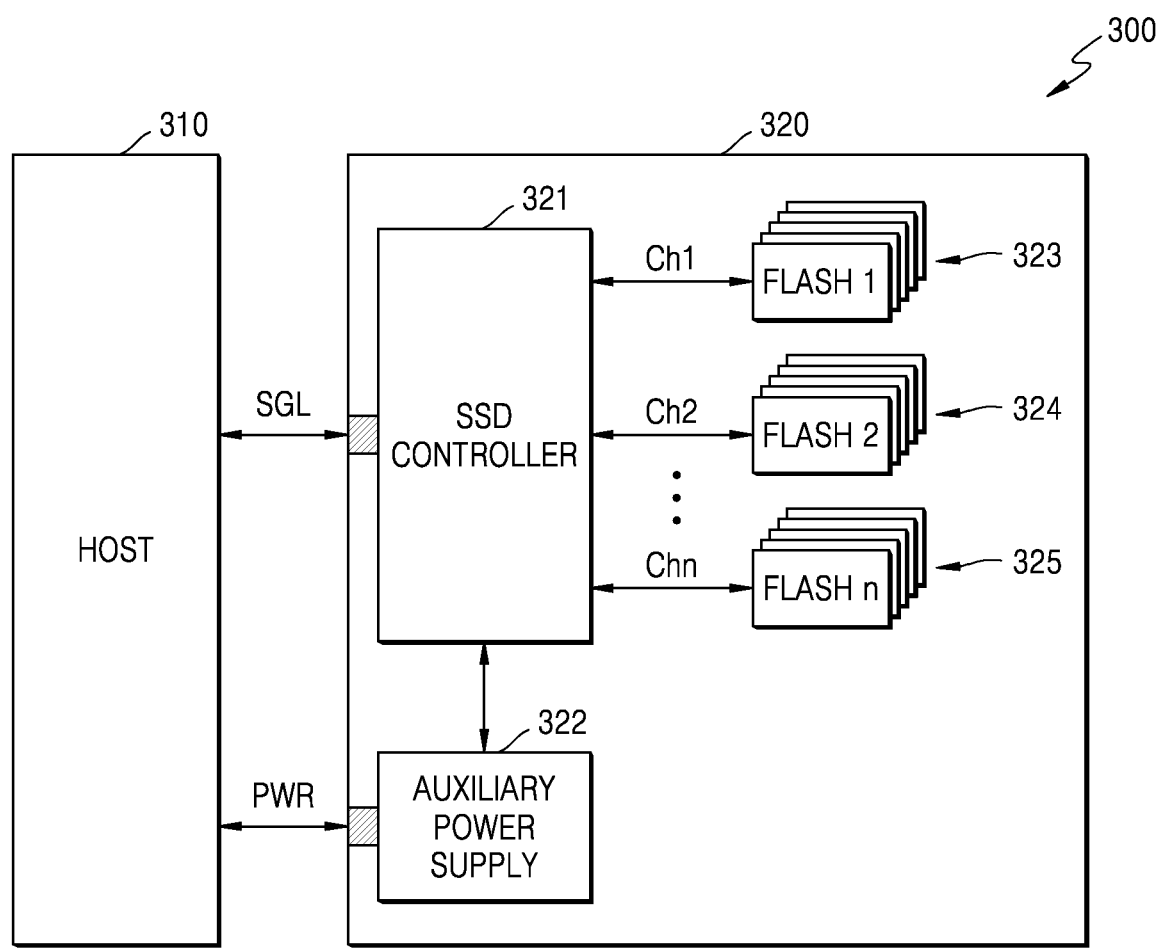
FIG. 13 is a block diagram of a solid-state drive (SSD) system according to some example embodiments of the inventive concepts.

FIG. 13 is a block diagram of an SSD system 300 according to some example embodiments of the inventive concepts.

Referring to FIG. 13, the SSD system 300 may include a host 310 and an SSD 320. The SSD 320 may exchange a signal (SGL) with the host 310 via a signal connector and receive power (PWR) via a power connector.

The SSD 320 may include an SSD controller 321, an auxiliary power device 322, and a plurality of memory devices 323, 324, and 325. The plurality of memory devices 323, 324, and 325 may include a vertically stacked NAND flash memory device. At least one of the plurality of memory devices 323, 324, and 325 may include the non-volatile memory device 120 described with reference to FIGS. 1 to 10. For example, at least one of the plurality of memory devices 323, 324, and 325 may perform a block reset operation under control by the SSD controller 321, according to the operating method according to some example embodiments described with reference to FIGS. 6 to 10.

Any of the elements and/or functional blocks disclosed above may include or be implemented in processing circuitry such as hardware including logic circuits; a hardware/software combination such as a processor executing software; or a combination thereof. For example, the memory controller 110, memory controller 212 and SSD controller 321 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof. While the inventive concepts have been particularly shown and described with reference to example embodiments thereof, it will be understood that various changes in form and details may be made therein without departing from the spirit and scope of the following claims.

What is claimed is:

1. An operating method of a memory system comprising a memory controller and a non-volatile memory device, the non-volatile memory device being operated under control of the memory controller, and the non-volatile memory device comprising a first memory block and a second memory block, the method comprising:
    determining, by the memory controller, whether the first memory block satisfies a block reset condition;
    in response to the first memory block satisfying the block reset condition, applying a turn-on voltage to word lines of dummy cells included in the first memory block;
    transferring data pre-programmed in the first memory block to the second memory block;
    erasing the first memory block; and
    re-programming the dummy cells of the first memory block.

2. The method of claim 1, wherein the determining of whether the first memory block satisfies the block reset condition, by the memory controller, comprises:
    in response to a voltage level of a threshold voltage of the dummy cells included in the first memory block being less than zero or greater than a voltage level of a first reference voltage, determining that the first memory block satisfies the block reset condition,
    wherein the voltage level of the first reference voltage has a threshold value at which the first memory block is capable of performing a read operation.

3. The method of claim 2, wherein a voltage level of the first reference voltage is equal to a first voltage level of a threshold voltage of memory cells included in the first memory block in response to a first amount of data being programmed in the memory cells.

4. The method of claim 1, wherein a voltage level of the turn-on voltage is greater than a first voltage level of a read voltage applied to word lines of memory cells included in the first memory block during a read operation.

5. The method of claim 1, wherein the second memory block comprises a memory block that does not satisfy the block reset condition.

6. An operating method of a non-volatile memory device, the non-volatile memory device comprising a first memory block, a second memory block and a third memory block, each of the first memory block, the second memory block and the third memory block comprising a first sub-block, a second sub-block, and a dummy block, the first sub-block comprising a first plurality of memory cells, the second sub-block comprising a second plurality of memory cells, and the dummy block comprising a plurality of dummy cells, the second sub-block being arranged on the first sub-block, and the dummy block being arranged between the first sub-block and the second sub-block, the method comprising:
    receiving a command for the first memory block to perform a first operation; and
    in response to the first memory block satisfying a block reset condition, performing a block reset operation on the first memory block, wherein the performing of the block reset operation comprises:
        applying a turn-on voltage to dummy word lines included in the dummy block of the first memory block,
        transferring, to the second memory block, data previously programmed in the first sub-block or the second sub-block of the first memory block,
        performing an erase operation entirely on the first memory block, and
        re-programming the dummy cells of the first memory block.

7. The method of claim 6, wherein
    the block reset condition is satisfied when a voltage level of a threshold voltage of the dummy cells of the first memory block is less than zero or greater than a voltage level of a first reference voltage, and
    the voltage level of the first reference voltage has a threshold value at which the first memory block is capable of performing a read operation.

8. The method of claim 6, wherein a voltage level of the turn-on voltage is greater than a first voltage level of a read voltage applied to word lines of memory cells of the first memory block during a read operation.

9. The method of claim 6, wherein the second memory block and the third memory block do not satisfy the block reset condition.

10. The method of claim 6, wherein the command comprises an erase command for the first sub-block or the second sub-block of the first memory block, the first sub-block being a sub-block to be erased, and,
    the method further comprising
        in response to the first memory block not satisfying the block reset condition, performing of the first operation by the first memory block based on the command by applying, to the dummy word lines of the first memory block, a voltage for not injecting a hole into the second sub-block or the first sub-block of the first memory block, the second sub-block being a sub-block not to be erased.

11. The method of claim 6, wherein
    the second sub-block of the first memory block contains data which was previously programmed, the command comprises a program command for the first sub-block of the first memory block, the method further comprising in response to the first memory block not satisfying the block reset condition, performing of the first operation by the first memory block based on the command by applying a block pass voltage to word lines included in the second sub-block of the first memory block and the dummy word lines of the first memory block, wherein a voltage level of the block pass voltage is equal to a voltage level of the turn-on voltage.

12. The method of claim 11, further comprising, in response to the first memory block satisfying the block reset condition, programming, in the second memory block, data that is to be programmed in the first sub-block of the first memory block, before the block reset operation is performed, wherein the transferring of the data previously programmed in the first memory block to the second memory block comprises transferring the data previously programmed in the second sub-block of the first memory block to an unprogrammed sub-block of the second memory block.

13. The method of claim 6, wherein the first sub-block of the first memory block has previously programmed data thereon, the command comprises a program command for the second sub-block of the first memory block, and the method further comprises in response to the first memory block satisfying a dummy block turn-off condition, applying a turn-off voltage to the dummy word lines of the first memory block; and in response to the first memory block not satisfying the dummy block turn-off condition, determining whether the first memory block satisfies the block reset condition.

14. The method of claim 13, wherein the dummy block turn-off condition is satisfied if a voltage level of a threshold voltage of the dummy cells of the first memory block is less than zero or greater than a voltage level of a second reference voltage, and the voltage level of the second reference voltage has a threshold value at which the dummy cells of the first memory block are capable of electrically blocking the first sub-block of the first memory block and the second sub-block of the first memory block.

15. The method of claim 13, further comprising:

in response to the first memory block not satisfying the block reset condition, applying the turn-on voltage to the dummy word lines of the first memory block before the first memory block performs the first operation based on the command; and in response to the first memory block satisfying the block reset condition, programming, in the second memory block, data that is to be programmed in the second sub-block of the first memory block, before the first memory block performs the block reset operation, wherein the transferring of the data previously programmed in the first memory block to the second memory block comprises transferring the data previously programmed in the first sub-block of the first memory block to an unprogrammed sub-block of the second memory block.

16. The method of claim 6, wherein the command comprises a read command for the first sub-block or the second sub-block of the first memory block, and the method further comprises:

detecting, by the non-volatile memory device, an error correction code (ECC) error of the first memory block; and in response to the first memory block not satisfying the block reset condition, transferring, to the second memory block, the data previously programmed in the first sub-block or the second sub-block of the first memory block.

17. A semiconductor apparatus comprising:

a memory controller configured to generate any one of a program command, a read command, or an erase command; and a non-volatile memory device which is operated under control by the memory controller, the non-volatile memory device comprising a first memory block and a second memory block, wherein the memory controller is configured to determine whether the first memory block satisfies a block reset condition, and the non-volatile memory device is configured to, in response to the first memory block satisfying the block reset condition, apply a turn-on voltage to word lines of dummy cells included in the first memory block, transfer data previously programmed in the first memory block to the second memory block, then erase the first memory block, and re-program the dummy cells of the first memory block.

18. The semiconductor apparatus of claim 17, wherein the block reset condition is satisfied if a voltage level of a threshold voltage of the dummy cells included in the first memory block is less than zero or greater than a voltage level of a first reference voltage, and the voltage level of the first reference voltage has a threshold value at which the first memory block is capable of performing a read operation.

19. The semiconductor apparatus of claim 18, wherein the voltage level of the first reference voltage is equal to a first voltage level of the threshold voltage of memory cells included in the first memory block while a first amount of data is programmed in the memory cells.

20. The semiconductor apparatus of claim 17, wherein the first memory block comprises:

a first sub-block comprising first memory cells that are unprogrammed;

a second sub-block arranged above the first sub-block, the second sub-block comprising second memory cells that are unprogrammed; and a dummy block arranged between the first sub-block and the second sub-block and comprising the dummy cells, wherein the memory controller is further configured to, before the second sub-block of the first memory block is programmed, determine whether the first memory block satisfies a dummy block turn-off condition, and in response to the first memory block not satisfying the dummy block turn-off condition, determine whether the first memory block satisfies the block reset condition, wherein the non-volatile memory device is further configured to, in response to the first memory block satisfying the dummy block turn-off condition, apply a turn-off voltage to the word lines of the dummy cells of the first memory block, and in response to the first memory block neither satisfying the dummy block turn-off condition nor the block reset condition, apply the turn-on voltage to the word lines of the dummy cells of the first memory block, wherein the dummy block turn-off condition is satisfied if a voltage level of a threshold voltage of the dummy cells of the first memory block is less than zero or greater than a voltage level of a second reference voltage, and wherein the voltage level of the second reference voltage has a threshold value at which the dummy cells of the first memory block are capable of electrically blocking the first sub-block and the second sub-block.

\* \* \* \* \*